(12) United States Patent
Black et al.

(10) Patent No.: US 9,134,047 B2
(45) Date of Patent: Sep. 15, 2015

(54) SYSTEMS, METHODS, AND APPARATUS FOR CRYOGENIC REFRIGERATION

(71) Applicant: D-Wave Systems Inc., Burnaby (CA)

(72) Inventors: Randall C. Black, San Diego, CA (US);
Jeremy P. Hilton, Burnaby (CA);
Geordie Rose, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 250 days.

(21) Appl. No.: 13/863,218

(22) Filed: Apr. 15, 2013

(65) Prior Publication Data
US 2013/0231249 A1    Sep. 5, 2013

Related U.S. Application Data

(62) Division of application No. 12/811,067, filed as application No. PCT/US2008/088245 on Dec. 23, 2008, now Pat. No. 8,464,542.

(60) Provisional application No. 61/017,460, filed on Dec. 28, 2007, provisional application No. 61/083,439, filed on Jul. 24, 2008, provisional application No. 61/086,432, filed on Aug. 5, 2008.

(51) Int. Cl.
*F25B 9/12* (2006.01)
*F25B 9/10* (2006.01)
(Continued)

(52) U.S. Cl.
CPC ... *F25B 9/12* (2013.01); *F25B 9/10* (2013.01); *G06F 1/20* (2013.01); *H01L 39/02* (2013.01); *H05K 7/20372* (2013.01); *G06F 2200/201* (2013.01)

(58) Field of Classification Search
CPC ............. F25B 9/12; F25B 9/10; H01L 39/02; H05K 7/20372; G06F 1/20; G06F 2200/201

USPC ............... 62/335, 46.1, 51.1, 6, 513; 505/153
See application file for complete search history.

(56) References Cited

U.S. PATENT DOCUMENTS 2,982,106 A  *  5/1961  Ambler ..................... 62/610
3,195,322 A  *  7/1965  London .................... 62/467
(Continued)

OTHER PUBLICATIONS

Black et al., "Systems, Methods, and Apparatus for Cryogenic Cycle Refrigeration," U.S. Appl. No. 61/017,460, filed Dec. 28, 2007, 85 pages.

(Continued)

*Primary Examiner* — Mohammad M Ali
(74) *Attorney, Agent, or Firm* — Seed IP Law Group PLLC

(57) ABSTRACT

Cryogenic refrigeration employs a pulse tube cryo-cooler and a dilution refrigerator to provide very low temperature cooling, for example, to cool superconducting processors. Continuous cryogenic cycle refrigeration may be achieved using multiple adsorption pumps. Various improvements may include multiple distinct thermal-linking points, evaporation pots with cooling structures, and/or one or more gas-gap heat switches which may be integral to an adsorption pump. A reservoir volume may provide pressure relief when the system is warmed above cryogenic temperature, reducing the mass of the system. Additional heat exchangers and/or separate paths for condensation and evaporation may be provided. Multi-channel connectors may be used, and/or connectors formed of a regenerative material with a high specific heat capacity at cryogenic temperature. Flexible PCBs may provide thermal links to components that embody temperature gradients. Various components may be pre-cooled, for example via a switchable thermalization system.

7 Claims, 22 Drawing Sheets

(51) Int. Cl.
*G06F 1/20* (2006.01)
*H05K 7/20* (2006.01)
*H01L 39/02* (2006.01)

(56) References Cited

U.S. PATENT DOCUMENTS

| | | | |
|---|---|---|---|
| 3,376,712 A * | 4/1968 | London | 62/467 |
| 4,400,183 A * | 8/1983 | Henrich et al. | 95/180 |
| 4,986,077 A | 1/1991 | Saho et al. | |
| 5,671,612 A * | 9/1997 | Menzenski | 62/611 |
| 5,780,314 A | 7/1998 | Chan | |
| 5,956,957 A | 9/1999 | Lowry et al. | |
| 6,378,312 B1 * | 4/2002 | Wang | 62/6 |
| 6,629,417 B2 | 10/2003 | Haas et al. | |
| 6,651,653 B1 * | 11/2003 | Honkonen et al. | 128/201.21 |
| 6,803,599 B2 | 10/2004 | Hilton et al. | |
| 7,323,963 B2 | 1/2008 | Nemoto et al. | |
| 7,533,068 B2 | 5/2009 | Maassen van den Brink et al. | |
| 7,619,437 B2 | 11/2009 | Thom et al. | |
| 2003/0024250 A1 | 2/2003 | Haas et al. | |
| 2004/0011074 A1 * | 1/2004 | Sano et al. | 62/434 |
| 2006/0097146 A1 * | 5/2006 | Strobel | 250/286 |
| 2006/0248618 A1 | 11/2006 | Berkley | |
| 2007/0107445 A1 * | 5/2007 | Boesel et al. | 62/51.1 |
| 2008/0176750 A1 | 7/2008 | Rose et al. | |
| 2008/0238531 A1 | 10/2008 | Harris | |
| 2009/0102580 A1 | 4/2009 | Uchaykin | |
| 2009/0121215 A1 | 5/2009 | Choi | |
| 2010/0157552 A1 | 6/2010 | Thom et al. | |

OTHER PUBLICATIONS

Burger et al., "165 K Microcooler Operating with a Sorption Compressor and a Micromachined Cold Stage," Cryocoolers 11:551-560, 2001.

Devlin et al., "A High Capacity Completely Closed-Cycle 250 mK 3He Refrigeration System Based on a Pulse Tube Cooler," Cryogenics 44:611-616, 2004.

International Search Report, mailed Aug. 17, 2009, for PCT/US2008/088245, 3 pages.

Maibaum et al., "Systems, Devices, and Methods for Analog Processing," U.S. Appl. No. 61/039,710, filed Mar. 26, 2008, 48 pages.

Pobell, Matter and Methods at Low Temperatures, Springer-Verlag, Germany, 1996, Chapter 7, "The 3He-4He Dilution Refrigerator," pp. 120-156.

Qiu et al., "Performance Improvement of a Pulse Tube Cooler Below 4 K by Use of GdAlO3 Regenerator Material," Cryogenics 41:693-696, 2001.

Sivokon et al., "Operating Features of a Dilution Refrigerator with Condensation Pumping," Low Temp. Phys. 19(4):312-316, 1993.

Thom et al., "Input/Output System and Devices for Use With Superconducting Devices," U.S. Appl. No. 12/016,801, filed Jan. 18, 2008, 132 pages.

Thom et al., "Input/Output System and Devices for Use With Superconducting Devices," U.S. Appl. No. 61/080,996, filed Jul. 15, 2008, 81 pages.

Uchaykin et al., "Systems, Methods, and Apparatus for Cryogenic Refrigeration," U.S. Appl. No. 61/083,439, filed Jul. 24, 2008, 31 pages.

Uchaykin et al., "Systems, Methods, and Apparatus for Cryogenic Refrigeration," U.S. Appl. No. 61/086,432, filed Aug. 5, 2008, 31 pages.

Written Opinion, mailed Aug. 17, 2009, for PCT/US2008/088245, 5 pages.

Black et al., "Systems, Methods, and Apparatus for Cryogenic Refrigeration," Office Action mailed Oct. 3, 2012, for U.S. Appl. No. 12/811,067, 14 pages.

Black et al., "Systems, Methods, and Apparatus for Cryogenic Refrigeration," Amendment filed Nov. 30, 2012, for U.S. Appl. No. 12/811,067, 10 pages.

\* cited by examiner

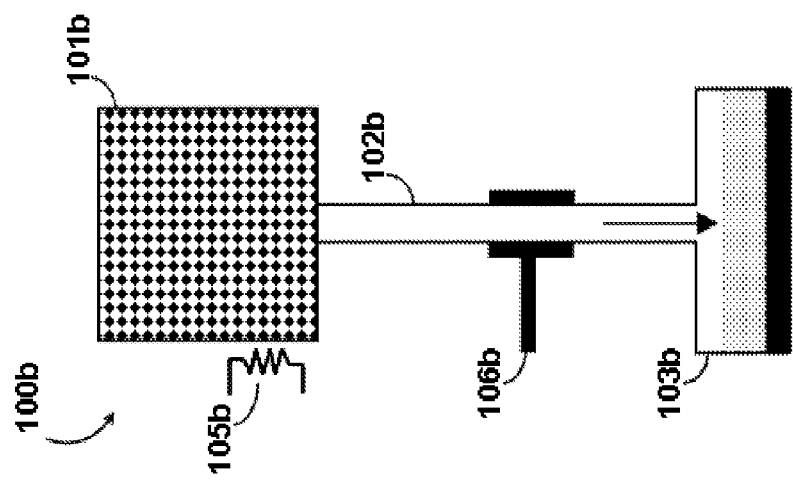
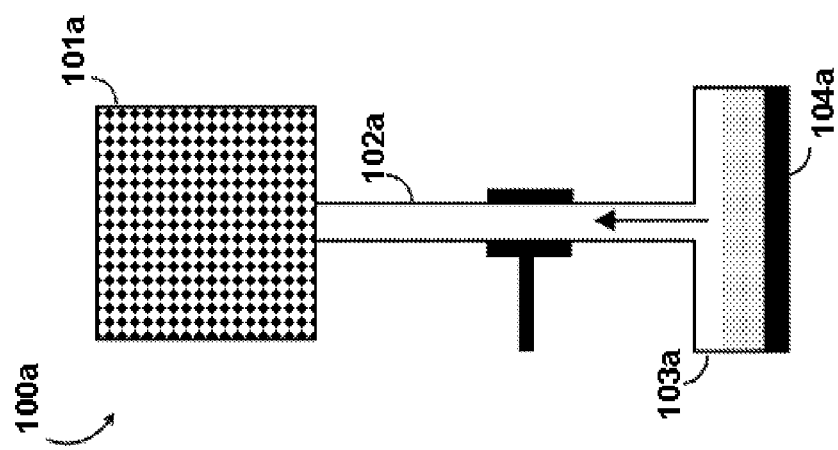

SYSTEMS, METHODS, AND APPARATUS FOR CRYOGENIC REFRIGERATION

BACKGROUND

1. Field

The present systems, methods and apparatus generally relate to cryogenic cycle refrigeration systems and in particular to the use of such refrigeration systems in the field of superconducting quantum computing.

2. Refrigeration

Temperature is a property that can have a great impact on the state and evolution of a physical system. For instance, environments of extreme heat can cause even the strongest and most solid materials to melt away or disperse as gas. Likewise, a system that is cooled to cryogenic temperatures may enter into a regime where physical properties and behavior differ substantially from what is observed at room temperature. In many technologies, it can be advantageous to operate in this cryogenic regime and harness the physical behaviors that are realized in the realm of cold. The various embodiments of the systems, methods and apparatus described herein may be used to provide and maintain the cryogenic environments necessary to take advantage of the physics at cold temperatures.

Throughout this specification and the appended claims, the term "cryogenic" is used to refer to the temperature range of 0 to about 93K. A variety of technologies may be implemented to produce an environment with cryogenic temperature, though a commonly used device that is known in the art is the dilution refrigerator. Dilution refrigerators can even be used to achieve extreme cryogenic temperatures below 50-mK. In the operation of a typical dilution refrigerator, the apparatus itself requires a background temperature of about 4K. Thus, the apparatus is typically immersed in an evaporating bath of liquid helium-4 ("$^4$He") to provide the ~4K background. The $^4$He bath may be contained in a vacuum chamber or dewar. By pumping the gas out of the dewar, a high vacuum level may be realized above the surface of liquid $^4$He and a temperature of around 1K can be achieved. Similarly, if the $^4$He is substituted with $^3$He, a temperature of approximately 0.3K can be achieved. The dilution refrigerator apparatus may comprise a series of heat exchangers and chambers that allow the temperature to be lowered further to a point where a mixture of $^3$He and $^4$He separates into two distinct phases and pure $^3$He can move into a mixture of $^3$He and $^4$He in a process analogous to evaporation, providing cooling and allowing a temperature of around 10-mK to be achieved. Full details on this dilution effect and the operation of typical dilution refrigerators may be found in F. Pobell, *Matter and Methods at Low Temperatures*, Springer-Verlag Second Edition, 1996, pp. 120-156.

In conventional dilution refrigerator ("CDR") designs, mechanical pumps and compressors, and an external gas-handling system, are used to circulate $^3$He such that it is warmed from the lowest temperature in the fridge up above cryogenic temperatures and towards room temperature before it is returned to the low temperature. The pumps and compressors used are large, expensive, noisy, in need of periodic maintenance, and they inevitably add contaminants to the helium that can plug fine capillaries in the dilution refrigerator, causing problems with reliability. Filters and cold traps can be used to reduce the frequency of plugging, but these systems remain susceptible to contamination due to the smallest leaks. Plugging often requires a complete warm-up of a CDR in order to remove the contaminants and restore the fridge to normal operations. The procedure of warming and subsequently cooling back down to operating temperatures can take several days. CDRs are large, complex, composed of many pieces that are connected by numerous hoses and wires, and they require an elaborate external gas handling system for the circulation of $^3$He. The various embodiments described herein address these issues to provide improvements to typical CDR designs.

Pulse Tube Cryo-Coolers

Pulse tube cryo-coolers ("PTs") are devices that may replace the liquid helium evaporating bath in CDRs to provide the initial cooling of ~4K. A typical PT provides cooling power by closed-cycle compression and expansion of helium. Examples of commercially-available PTs include those made by Cryomech, Inc. of Syracuse, N.Y. Examples of commercially-available pulse tube dilution refrigerators ("PTDRs") include those made by Leiden Cryogenics BV of Leiden, the Netherlands and those made by VeriCold Technologies GmbH of Ismaning, Germany. While these PTDR systems eliminate the need to consume helium by way of open loop evaporation, they are still expensive, large, complex, multi-piece, multi-connection systems that require an external gas handling system to bring the helium above cryogenic temperatures in providing the required circulation needed for cooling. Due to this complexity, they are prone to leaking and plugging, and require routine and unexpected maintenance of many of the components.

Cryogenic Cycle Dilution Refrigerator

In cryogenic cycle dilution refrigerator ("CCDR") designs, the external gas handling system used to circulate helium in CDRs is not required. The elimination of the external gas handling system can reduce the size, complexity, and maintenance requirements of a dilution refrigeration system. CCDRs operate by using at least one adsorption pump to circulate helium without ever warming the helium above cryogenic temperatures. The adsorption pumping technique takes advantage of the tendency of gas to condense or adsorb on cold surfaces and be released again in liquid form under the influence of gravity, and to "desorb" from the cold surface when said surface is warmed. By incorporating a pulse tube cryo-cooler instead of a liquid helium dewar, a cryogenic cycle pulse tube dilution refrigerator ("CCPTDR") can be made. This device can be made much smaller, simpler, cheaper and more reliable than typical PTDRs.

The adsorption pumps that can be used to build a CCPTDR are inherently "single shot" devices, meaning that they can pump for a while but then need to be regenerated before they can pump again. An adsorption pump is regenerated by warming it up, and thereby causing the gas (helium) that it has adsorbed to be released. In order to provide continuous cooling, multiple adsorption pumps can be used in such a way that when one or more of the adsorption pumps is/are pumping, one or more others can be regenerating. In this way a continuous cryogenic cycle pulse tube dilution refrigerator ("CCCPTDR") can be realized. As a self-contained system, a CCCPTDR can be advantageous in many applications because it is more compact, less complex, and more reliable than alternative cryogenic refrigerator designs, such as the CDR and the PTDR.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, US Patent Publication No. 2008-0176750, U.S. patent application Ser. No. 12/266, 378, and U.S. Provisional Patent Application Ser. No. 61/039, 710, filed Mar. 26, 2008 and entitled "Systems, Devices, And Methods For Analog Processing."

A superconducting quantum processor may include a number of coupling devices operable to selectively couple respective pairs of qubits. Example of superconducting qubits include superconducting flux qubits, superconducting phase qubits, superconducting charge qubits, and superconducting hybrid qubits. Examples of devices that may be implemented as superconducting qubits and/or superconducting coupling devices include rf-SQUIDs and dc-SQUIDs. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. patent application Ser. No. 12/017,995. Respective coupling strengths of the coupling devices may be tuned between zero and a maximum value, for example, to provide ferromagnetic or anti-ferromagnetic coupling between qubits.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

According to the present state of the art, a superconducting material may generally only act as a superconductor if it is cooled below a critical temperature that is characteristic of the specific material in question. For this reason, those of skill in the art will appreciate that a computer system that implements a superconducting processor, such as a superconducting quantum processor, may require a refrigeration system for cooling the superconducting materials in the system.

In the known art, superconducting computer systems that incorporate superconducting processors and/or superconducting quantum processors have primarily been implemented in the contexts of academia and in-house research and development. Such implementations are generally realized in facilities that can accommodate the size, expense, complexity, and high maintenance demands of typical CDRs and PTDRs. However, it may be advantageous for a provider of a superconducting computer system to endeavor to reduce the expected maintenance demands of the refrigeration system and to consider the potential facility limitations of a recipient of the system. For instance, a recipient of a superconducting computer system may prefer to operate the system within an existing server room or, in general, within a room with limited space that cannot easily accommodate, for example, an external gas handling system.

BRIEF SUMMARY

At least one embodiment may be summarized as a superconducting computer system including a pulse tube cryo-cooler operable to provide cooling power at a first temperature; a dilution refrigerator thermally coupled to be at least partially driven by the cooling power provided by the pulse tube cryo-cooler; a superconducting computer processor substantially thermally coupled to at least a portion of the dilution refrigerator, and an input/output system configured to provide electrical communication to and from the superconducting computer processor.

The superconducting computer system may further include a cryogenic cycle refrigerator thermally coupled to be at least partially driven by the cooling power provided by the pulse tube cryo-cooler, wherein the cryogenic cycle refrigerator provides cooling power at a second temperature, the second temperature being lower than the first temperature, and wherein the dilution refrigerator is at least partially driven by the cooling power provided by the cryogenic cycle refrigerator.

The pulse tube cryo-cooler may include a cold head, the cold head providing at least one thermal-linking point that provides cooling power at cryogenic temperature, and wherein the cryogenic cycle refrigeration system may include a first adsorption pump and a second adsorption pump, both the first and the second adsorption pumps including a respective quantity of adsorbent material enclosed within a container, wherein the first and the second adsorption pumps are both selectively thermally coupled to a thermal-linking point of the cold head; a first heating device and a second heating device, each of the first and the second heating devices being positioned in close proximity to a respective one of the first and the second adsorption pumps; a first tubular channel and a second tubular channel both capable of providing fluid passage therethrough, wherein the first and the second tubular channels both include a respective condensation region, the respective condensation regions each thermally coupled to a thermal-linking point of the cold head; at least two evaporation pots, each of the at least two evaporation pots coupled to a respective one of the first and the second adsorption pumps by a respective one of the first and the second tubular channels such that the first and the second respective combinations of adsorption pump, tubular channel, and evaporation pot respectively form a first sealed enclosure and a second sealed enclosure; and a first and a second quantity of a coolant substance, each of the first and the second quantities of coolant substance contained within a respective one of the first and the second sealed enclosures; wherein at least a portion of the dilution refrigerator is substantially thermally coupled to the first and the second evaporation pots. The coolant substance may include at least one of helium-3 and helium-4.

The superconducting computer system may further include at least one enclosure that contains the superconducting computer processor, the at least one enclosure providing a degree of thermal radiation shielding. The superconducting computer processor may include a superconducting quantum processor, the superconducting quantum processor including at least one of the devices selected from the group consisting of: a superconducting flux qubit, a superconducting phase qubit, a superconducting charge qubit, a superconducting hybrid qubit, and a superconducting qubit coupler.

At least one embodiment may be summarized as a cryogenic cycle refrigeration system including a first adsorption pump and a second adsorption pump, both the first and the second adsorption pumps including a respective quantity of adsorbent material enclosed within a container; a plurality of tubular channels each capable of providing fluid passage therethrough, wherein a first one and a second one of the tubular channels both include a respective condensation region, the respective condensation regions each thermally coupled to at least one cold source within the refrigeration system; a first evaporation pot and a second evaporation pot, each of the first and second evaporation pots coupled to a respective one of the first and the second adsorption pumps by a respective one of the first and the second tubular channels; and a heat exchanger that provides thermal coupling between at least two of the tubular channels.

The refrigeration system may further include a third tubular channel and a fourth tubular channel each capable of providing fluid passage therethrough, wherein the third tubular channel is coupled in parallel with the first tubular channel to provide fluid communication between the first adsorption pump and the first evaporation pot, and the fourth tubular channel is coupled in parallel with the second tubular channel to provide fluid communication between the second adsorption pump and the second evaporation pot, and wherein the heat exchanger includes a first thermal link coupled between the first and the fourth tubular channels and a second thermal link coupled between the second and the third tubular channels.

At least one embodiment may be summarized as a cryogenic cycle refrigeration system including a first adsorption pump and a second adsorption pump, both of the first and the second adsorption pumps including a respective quantity of adsorbent material enclosed within a container; a first tubular channel and a second tubular channel each capable of providing fluid passage therethrough, at least a portion of both the first and the second tubular channels being formed by a respective piece of a thermally regenerative material with high specific heat capacity at cryogenic temperature, wherein the first and the second tubular channels both include a respective condensation region, the respective condensation regions each thermally coupled to at least one cold source within the refrigeration system; a first evaporation pot and a second evaporation pot, each of the first and second evaporation pots coupled to a respective one of the first and the second adsorption pumps by a respective one of the first and the second tubular channels such that the first and the second respective combinations of adsorption pump, tubular channel, and evaporation pot respectively form a first sealed enclosure and a second sealed enclosure; and a first and a second quantity of coolant substance, each of the first and the second quantities of coolant substance contained within a respective one of the first and the second sealed enclosures. The regenerative material may include $GdAlO_3$.

At least one embodiment may be summarized as a cryogenic cycle refrigeration system including a first adsorption cooler apparatus including a first adsorption pump, a first evaporation pot, and a first and a second tubular channel which provide parallel fluid communication between the first adsorption pump and the first evaporation pot, the second tubular channel including a first condensation region that is thermally coupled to a cold source in the refrigeration system; a second adsorption cooler apparatus including a second adsorption pump, a second evaporation pot, and a third and a fourth tubular channel which provide parallel fluid communication between the second adsorption pump and the second evaporation pot, the fourth tubular channel including a second condensation region and a third condensation region wherein the second condensation region is thermally coupled to the cold source in the refrigeration system; wherein the first adsorption cooler apparatus contains helium-4 coolant and the second adsorption apparatus contains helium-3 coolant, and wherein the first evaporation pot is thermally coupled to the third condensation region of the fourth tubular channel.

At least one embodiment may be summarized as a cryogenic cycle refrigeration system including a first adsorption cooler apparatus including a first adsorption pump, a first evaporation pot, and a first tubular channel, wherein the first tubular channel provides fluid communication between the first adsorption pump and the first evaporation pot, and wherein the first tubular channel includes a first condensation region that is thermally coupled to a cold source in the refrigeration system; a second adsorption cooler apparatus including a second adsorption pump, a second evaporation pot, and a second tubular channel, wherein the second tubular channel provides fluid communication between the second adsorption pump and the second evaporation pot, and wherein the second tubular channel includes a second condensation region that is thermally coupled to a cold source in the refrigeration system; a third adsorption cooler apparatus including a third adsorption pump, a third evaporation pot, and a third tubular channel, wherein the third tubular channel provides fluid communication between the third adsorption pump and the third evaporation pot, and wherein the third tubular channel includes a third condensation region that is thermally coupled to a cold source in the refrigeration system; and a fourth adsorption cooler apparatus including a fourth adsorption pump, a fourth evaporation pot, and a fourth tubular channel, wherein the fourth tubular channel provides fluid communication between the fourth adsorption pump and the fourth evaporation pot, and wherein the fourth tubular channel includes a fourth condensation region that is thermally coupled to a cold source in the refrigeration system; wherein the first evaporation pot is thermally coupled to an additional condensation region in the second tubular channel, and the fourth evaporation pot is thermally coupled to an additional condensation region in the third tubular channel.

At least one embodiment may be summarized as an adsorption pump with integrated gas-gap heat switch including an adsorbent material contained within a first enclosure, the first enclosure including an outer wall; a second enclosure enveloping the first enclosure, the second enclosure including an inner wall, such that a gap is formed in between the outer wall of the first enclosure and the inner wall of the second enclosure; an adsorption pump that is coupled to the gap by a tubular channel that provides fluid communication in between the gap and the adsorption pump; wherein the gap includes an exchange gas such that, when the adsorption pump is inactive, the exchange gas provides thermal communication between the outer wall of the first enclosure and the inner wall of the second enclosure and when the adsorption pump is active, the exchange gas is evacuated from the gap and the first and second enclosure are substantially thermally isolated from one another.

At least one embodiment may be summarized as a cryogenic cycle refrigeration system including a pulse tube cryocooler including a cold head, wherein the cold head comprises: a first thermal-linking point and a second thermal-linking point, wherein the first thermal-linking point is configured to provide cooling power at a first cryogenic temperature and the second thermal-linking point is configured to provide cooling power at a second cryogenic temperature and wherein the second cryogenic temperature is colder than the first cryogenic temperature; and at least one intermediate thermal-linking point, wherein the at least one intermediate thermal-linking point is configured to provide cooling power at a cryogenic temperature of a magnitude that is warmer than the second cryogenic temperature and colder than the first cryogenic temperature; and at least one adsorption cooler apparatus including an adsorption pump, an evaporation pot, and a tubular channel coupled to provide fluid communication between the adsorption pump and the evaporation pot, wherein the tubular channel includes a condensation region and at least one of the adsorption pump and the condensation region is thermally coupled to at least one intermediate thermal-linking point of the cold head. The at least a third intermediate thermal-linking point may be a discrete and localized point that is configured to provide cooling power at an approximately constant temperature in operation. The at least a third intermediate thermal-linking point may be continuously spread out over a finite region and configured to provide cooling power at a range of temperatures of magnitude in between the first cryogenic temperature and the second cryogenic temperature.

At least one embodiment may be summarized as a cryogenic cycle refrigeration system including an adsorption pump including a quantity of adsorbent material enclosed within a container; a tubular channel providing fluid passage therethrough, wherein the tubular channel includes a condensation region, the condensation region thermally coupled to a cold source within the refrigeration system; an evaporation pot including a bottom internal surface, the evaporation pot coupled to the adsorption pump by the tubular channel; wherein the bottom internal surface of the evaporation pot includes a plurality of elongated slots extending partially therethrough. At least two of the plurality of elongated slots may be connected such that liquid coolant contained in the connected slots is substantially uniformly distributed therebetween. The elongated slots may be arranged in a pattern selected from the group consisting of: a radial pattern, a substantially radial pattern, a parallel alignment, and a grid pattern.

At least one embodiment may be summarized as a cryogenic cycle refrigeration system including an adsorption pump including a quantity of adsorbent material enclosed within a container; a tubular channel providing fluid passage therethrough, wherein the tubular channel includes a condensation region, the condensation region thermally coupled to a cold source within the refrigeration system; and an evaporation pot including a bottom internal surface, the evaporation pot coupled to the adsorption pump by the tubular channel; wherein the bottom internal surface of the evaporation pot includes a plurality of cavities extending partially therethrough, each cavity having a respective volume, and wherein the cavities nearest the tubular channel have a larger volume than cavities that are relatively further from the tubular channel. The cavities may each have a respective depth and the relative depths of the cavities may be such that the individual cavities nearest to the tubular channel have greater depth than the individual cavities furthest from the tubular channel. The relative depths of the cavities may collectively form a curve selected from the group consisting of: a piecewise curve and a continuous curve. The plurality of cavities may include at least one elongated slot.

At least one embodiment may be summarized as a cryogenic cycle refrigeration system including an adsorption pump including a quantity of adsorbent material enclosed within a container; a tubular channel providing fluid passage therethrough, wherein the tubular channel includes a condensation region, the condensation region being thermally coupled to a cold source within the refrigeration system; and an evaporation pot including a bottom internal surface, the evaporation pot being coupled to the adsorption pump by the tubular channels; wherein the bottom internal surface of the evaporation pot includes a plurality of protrusions extending upwards from the bottom internal surface of the evaporation pot.

At least one embodiment may be summarized as a cryogenic cycle refrigeration system including an adsorption pump including a quantity of adsorbent material enclosed within a container; a tubular channel including a plurality of longitudinal passages each providing fluid passage therethrough, wherein the tubular channel includes a condensation region, the condensation region thermally coupled to a cold source within the refrigeration system; and an evaporation pot coupled to the adsorption pump by the tubular channel.

At least one embodiment may be summarized as a cryogenic cycle refrigeration system including an adsorption pump including a quantity of adsorbent material enclosed within a container; a tubular channel providing fluid passage therethrough; an evaporation pot coupled to the adsorption pump by the tubular channel; and a reservoir volume that is connected to at least one of the adsorption pump, the tubular channel, and the evaporation pot through a low-volume capillary tube that provides a fluid communication channel; and a valve operable to selectively open and close the fluid communication channel.

At least one embodiment may be summarized as a pulse tube cryogenic cycle refrigeration system including a pulse tube cryo-cooler having a cold head, the cold head including at least one thermal-linking point that provides cooling power at cryogenic temperature; a first adsorption pump and a second adsorption pump, wherein the first and the second adsorption pumps are both selectively thermally coupled to a thermal-linking point of the cold head; a first heating device and a second heating device, each of the first and the second heating devices positioned in close proximity to a respective one of the first and the second adsorption pumps; a first tubular channel and a second tubular channel each capable of providing fluid passage therethrough, wherein the first and the second tubular channels both include a respective condensation region, the respective condensation regions each thermally coupled to a thermal-linking point of the cold head; and a first evaporation pot coupled to the first adsorption pump by the first tubular channel and a second evaporation pot coupled to the second adsorption pump by the second tubular channel; wherein each respective thermal coupling to a thermal-linking point of the pulse tube cold head is realized through a substantially separate thermal coupling path.

At least one embodiment may be summarized as a pulse tube cryogenic cycle refrigeration system including a pulse tube cryo-cooler having a cold head, the cold head including at least one thermal-linking point that provides cooling power at cryogenic temperature; a first adsorption pump and a second adsorption pump, wherein the first and the second adsorption pumps are both selectively thermally coupled to a thermal-linking point of the cold head; a first heating device and a second heating device, each of the first and the second heating devices positioned in close proximity to a respective one of the first and the second adsorption pumps; a first tubular channel and a second tubular channel each capable of providing fluid passage therethrough, wherein the first and the second tubular channels both include a respective condensation region, the respective condensation regions each thermally coupled to a thermal-linking point of the cold head; a first evaporation pot coupled to the first adsorption pump by the first tubular channel and a second evaporation pot coupled to the second adsorption pump by the second tubular channel;

and at least one sealed container enclosing at least a portion of the refrigeration system, wherein the at least one sealed container includes a quantity of adsorbent material and an exchange gas such that the exchange gas fills the at least one sealed container while a temperature of the adsorbent material exceeds an adsorbent temperature, and the exchange gas is adsorbed by the adsorbent material, effectively evacuating the at least one sealed container, when the temperature of the adsorbent material reaches or falls below an adsorbent temperature.

At least one embodiment may be summarized as a thermal linking system to transfer heat from a heat source within a refrigeration system to a component of the refrigeration system. The thermal linking system may include a length of dielectric substrate having a first end and a second end and carrying at least two thermally conductive traces that each extend along the length of dielectric substrate from the first end to the second end; wherein the first end of the dielectric substrate is thermally linked to the heat source within the refrigeration system to provide substantial thermal coupling between the heat source and the at least two thermally conductive traces, and wherein the second end of the dielectric substrate is thermally linked to the component of the refrigeration system to provide substantial thermal coupling between the component and the at least two thermally conductive traces, and wherein the at least two thermally conductive traces are substantially thermally isolated from one another. The length of dielectric substrate carrying at least two thermally conductive traces may include a flexible printed circuit board. The component of the refrigeration system may embody a temperature gradient such that thermal coupling between the component and a first one of the at least two thermally conductive traces is realized at a first temperature and thermal coupling between the component and a second one of the at least two thermally conductive traces is realized at a second temperature, wherein the second temperature is colder than the first temperature. The refrigeration system may include a pulse tube cryo-cooler and the component of the refrigeration system may include a regenerator in the pulse tube cryo-cooler.

At least one embodiment may be summarized as a refrigeration system comprising a first stage providing cooling power at a first temperature; a second stage providing cooling power at a second temperature; and a switchable thermalization system that includes a first switchable thermal link, wherein the first switchable thermal link is physically coupled to both the first stage and the second stage, and wherein the first switchable thermal link is switchable between a thermally conductive state and a substantially thermally isolative state, such that the first switchable thermal link provides thermal coupling between the first stage and the second stage while the refrigeration system operates in a first temperature range and the first switchable thermal link provides substantial thermal isolation between the first stage and the second stage while the refrigeration system operates in a second temperature range, wherein the second temperature range is colder than the first temperature range. The first switchable thermal link may be formed of a material that is superconducting below a critical temperature such that the first switchable thermal link is thermally conductive while above the critical temperature and substantially thermally insulative when cooled below the critical temperature. The first switchable thermal link may include a controllable thermal switch uses magnetic forces to controllably establish thermal contact between two thermal terminals.

The refrigeration system may further comprise a third stage providing cooling power at a third temperature; wherein the switchable thermalization system further comprises a second switchable thermal link, wherein the second switchable thermal link is physically coupled to both the second stage and the third stage, and wherein the second switchable thermal link is switchable between a thermally conductive state and a substantially thermally isolative state, such that the second switchable thermal link provides thermal coupling between the second stage and the third stage while the refrigeration system operates in the first temperature range and the second switchable thermal link provides substantial thermal isolation between the second stage and the third stage while the refrigeration system operates in the second temperature range.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

FIG. 1A is a schematic diagram of an embodiment of a cryogenic cycle refrigeration system in its cooling phase.

FIG. 1B is a schematic diagram of an embodiment of a cryogenic cycle refrigeration system in its regeneration phase.

DETAILED DESCRIPTION

Figure 2:
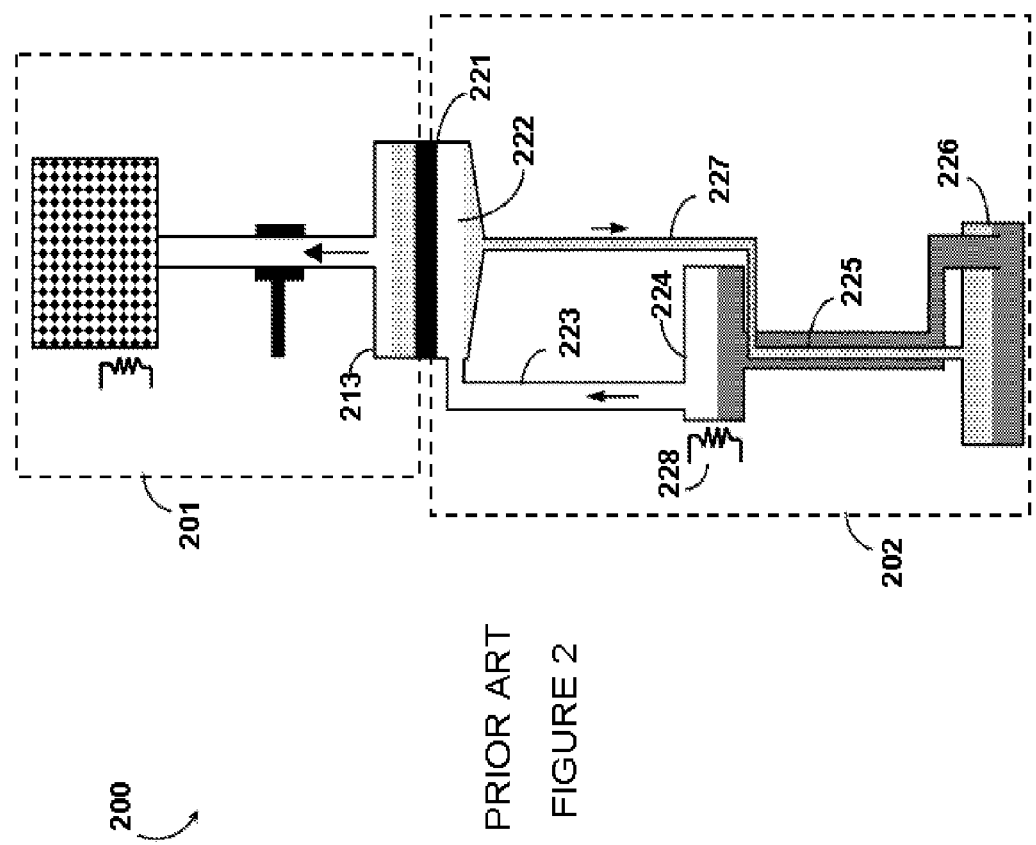
FIG. 2 is a schematic diagram of an embodiment of a cryogenic cycle dilution refrigerator.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, specific detail of certain structures associated with refrigeration systems, such as thermalization links, support structures, and tubes/hoses, have not been shown or elaborated to avoid unnecessarily obscuring descriptions of the embodiments of the present systems, methods and apparatus.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment," "an embodiment" or "another embodiment" means that a particular referent feature, structure or characteristic described in connection with the embodiment is included in at least one embodiment. Thus, the appearances of the phrases "in one embodiment," "in an embodiment" or "another embodiment" in various places throughout this specification are not necessarily all referring to the same embodiment. Furthermore, the particular features, structures or characteristics may be combined in any suitable manner in one or more embodiments.

It should be noted that, as used in this specification and the appended claims, the singular forms "a," "an" and "the" include plural referents unless the content clearly dictates otherwise. Thus, for example, reference to "an adsorption pump" includes a single adsorption pump or two or more adsorption pumps. It should also be noted that the term "or" is generally employed in its sense including "and/or" unless the content clearly dictates otherwise.

Furthermore, it should be noted that while a portion of this specification and the appended claims describes the application of this disclosure with a quantum processor comprising superconducting qubits, those of skill in the art will appreciate that the systems, methods and apparatus described herein may easily be adapted to apply to other superconducting devices including, but not limited to, other forms of superconducting quantum processors.

The headings provided herein are for convenience only and do not interpret the scope or meaning of the embodiments.

In accordance with the present systems, methods and apparatus, various designs of a continuous cryogenic cycle pulse tube dilution refrigerator ("CCCPTDR") are described. As previously described, a CCCPTDR can be advantageous over a PTDR or a CDR because a CCCPTDR is a less complex and more compact system. Firstly, the pulse tube cryo-cooler may be used to provide a background cryogenic environment for the dilution refrigerator, thereby eliminating the need for a large liquid helium evaporation bath and associated pumping system (as described in the PTDR design). Secondly, the pulse tube cryo-cooler may also be used to drive the cryogenic cycle refrigeration system (adsorption pumps), which may be used to provide cooling power to drive the dilution refrigerator, thereby eliminating the need for an external gas handling system in driving the dilution refrigerator. Thus, the CCCPTDR provides a self-contained system that may be advantageous in many applications, including the operation of a superconducting computer system within a limited facility. However, those of skill in the art will appreciate that the various embodiments described herein may alternatively incorporate a liquid helium evaporation bath contained in a vacuum chamber or dewar in place of a pulse tube cryo-cooler.

FIG. 1A is a schematic diagram of an embodiment of a cryogenic cycle refrigeration system 100a in its cooling phase. System 100a includes adsorption pump 101a, which may include an adsorbing material such as charcoal or Zeolite. Adsorption pump 101a may be cooled by a thermal connection to the system cold source (such as a pulse tube cryo-cooler or a bath of liquid helium, neither of which is shown in FIG. 1A). When adsorption pump 101a is cooled below a critical temperature (typically$<\sim$10K), it adsorbs a coolant gas (e.g., helium gas) present in tube 102a, causing a drop in pressure in tube 102a. This drop in pressure induces more liquid coolant to evaporate from evaporation pot 103a, resulting in a decrease in the temperature of liquid coolant in pot 103a. The desired effect of this process is that the bottom surface 104a of pot 103a is cooled by adsorption pump 101a. In some embodiments that implement $^3$He, the bottom surface 104a of pot 103a may reach a temperature of $\sim$0.4K.

Adsorption pumps are inherently "single-shot" devices, meaning that they can be operated for a time but eventually they must be regenerated. System 100a requires regeneration either when adsorption pump 101a is saturated with coolant, or when there is no liquid coolant left in pot 103a. The various embodiments described herein implement helium as the coolant, though those of skill in the art will appreciate that alternative coolant substances may be used. During regeneration, adsorption pump 101a is heated (typically to $\sim$40K), which causes helium to desorb from the adsorbing material. FIG. 1B is a schematic diagram of an embodiment of a cryogenic cycle refrigeration system 100b in its regeneration phase. System 100b is similar to system 100a, but shown in a different phase of operation. During regeneration, heat may be applied to adsorption pump 101b by heater 105b. This heat may cause gaseous helium to desorb from pump 101b and, due to the building pressure in pump 101b, flow into tube 102b. As the gaseous helium passes through tube 102b, it is cooled by condenser 106b which is thermally coupled to the system cold source (such as a pulse tube cryo-cooler or a bath of liquid helium, neither of which is shown in FIG. 1B). When the helium condenses, it liquefies on the walls of tube 102b and flows down under the influence of gravity to collect in evaporation pot 103b. After a period of time, a sufficient quantity of helium will have desorbed from pump 101b and collected in pot 103b such that heater 105b may be deactivated. System 100b will then gradually cool and switch into its pumping state.

As previously described, a cryogenic cycle refrigeration system may be used to drive a dilution refrigerator. FIG. 2 is a schematic diagram of an embodiment of a cryogenic cycle dilution refrigerator system 200. System 200 includes a cryogenic cycle refrigerator 201, which functions in a similar way to that described for systems 100a and 100b of FIGS. 1A and 1B, respectively, and a dilution refrigerator 202. The bottom surface of evaporation pot 213 in cryogenic cycle refrigerator 201 is in thermal contact with (or, in some embodiments, shared with) the condensation surface 221 of condensation chamber 222, thereby providing a cold source that drives dilution refrigerator 202. As previously discussed, both the design and operation of a dilution refrigerator are known in the art. In brief, dilution refrigerator 202 includes pumping tube 223 that provides a fluid connection between condensation chamber 222 and still 224. The liquid coolant in dilution refrigerator 202 is, for the most part, a mixture of $^3$He and $^4$He, though primarily $^3$He is circulated. Still 224 is connected by counter-flow heat exchanger 225 to mixing chamber 226, which is connected by tube 227 to condensation chamber 222. In operation, still 224 may be heated by heater 228 to ~0.7-1.0K causing some liquid $^3$He to evaporate from the mixture of $^3$He and $^4$He. The evaporated $^3$He enters into tube 223, where it is cryo-pumped by the colder (~0.4K) surface 221 of chamber 222. Condensation surface 221 of condensation chamber 222 is cooled by cryogenic cycle refrigerator 201. When the evaporated $^3$He reaches chamber 222, it condenses on surface 221 and then, under the influence of gravity, drips into chamber 222. Condensed liquid $^3$He runs down from chamber 222 in tube 227 and enters the top of mixing chamber 226, which contains the $^3$He—$^4$He mixture. The $^3$He may then cool mixing chamber 226 by crossing the phase boundary from the pure $^3$He state to a mixed $^3$He—$^4$He state. Under the influence of the osmotic pressure gradient, $^3$He exits mixing chamber 226 through counter-flow heat exchanger 225 and returns to still 224. Using this scheme, embodiments of dilution refrigerators, such as dilution refrigerator 202, are able to produce temperatures in the milliKelvin range.

As previously discussed, the adsorption pump used in cryogenic cycle refrigerator 201 is inherently a single-shot device that requires regeneration. During regeneration of cryogenic cycle refrigerator 201, circulation of helium in dilution refrigerator 202 may cease as condensation surface 221 begins to warm up. In many applications, it is desired to realize continuous operation of dilution refrigerator 202 as opposed to the cyclical operation provided by system 200.

Figure 3:
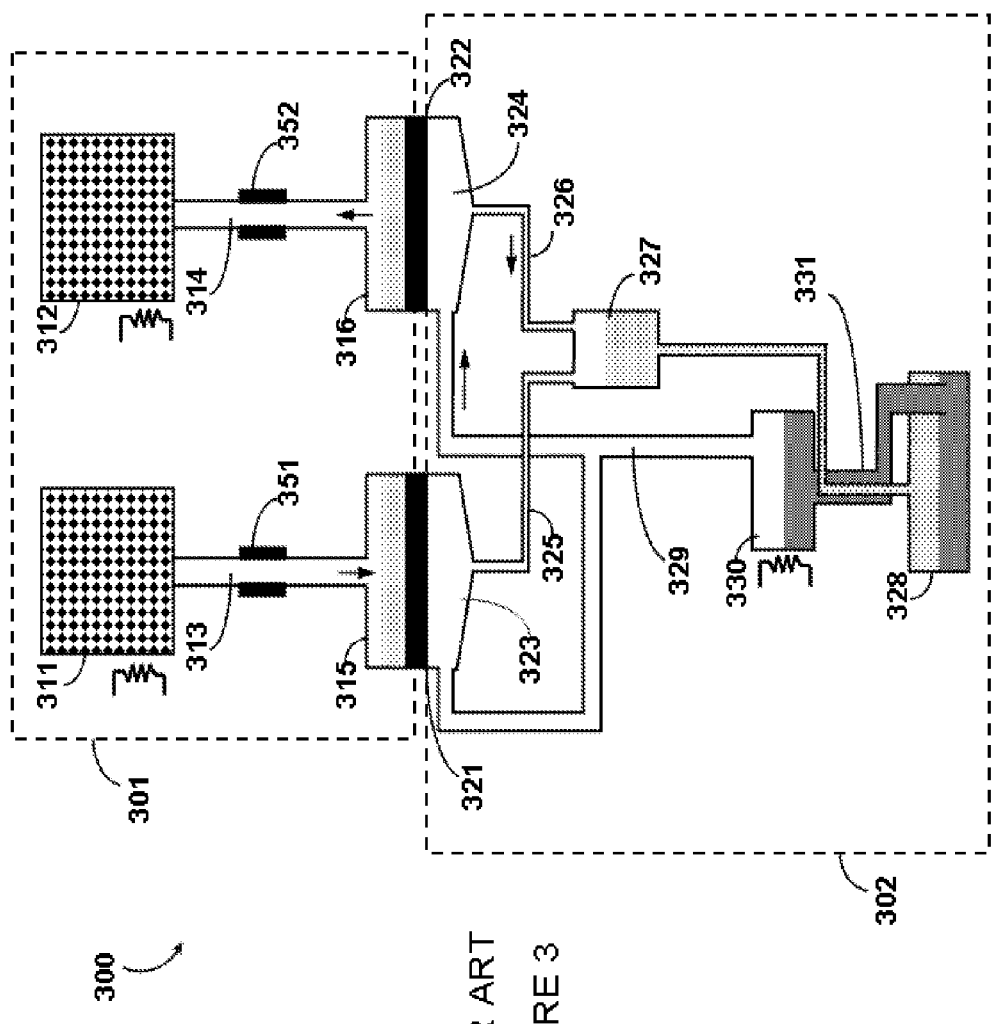
FIG. 3 is a schematic diagram of an embodiment of a continuous cryogenic cycle dilution refrigerator.

FIG. 3 is a schematic diagram of an embodiment of a continuous cryogenic cycle dilution refrigerator system 300. System 300 includes continuous cryogenic cycle refrigerator 301 and dilution refrigerator 302. System 300 operates in a similar manner to that described for system 200 in FIG. 2, except that system 300 is capable of operating continuously without pausing for cyclical regeneration phases. Continuous cryogenic cycle refrigerator 301 includes two adsorption pumps, 311 and 312, each being connected by a respective tube, 313 and 314, to a respective evaporation pot 315 and 316. Thus, continuous cryogenic cycle refrigerator 301 effectively comprises two cryogenic cycle refrigerators, each of which operates in a similar way to that described in FIGS. 1A and 1B. In operation, one adsorption pump (312 as illustrated in FIG. 3) is pumping while the other adsorption pump (311 as illustrated in FIG. 3) is regenerating, thereby ensuring that at least one of pots 315 and 316 is cold at all times. Continuous cryogenic cycle refrigerator 301 is coupled to dilution refrigerator 302 such that each of pots 315 and 316 provides a respective condensation surface 321 and 322 in dilution refrigerator 302. Thus, when pot 316 is cold (as illustrated in FIG. 3), condensation surface 322 drives the circulation in dilution refrigerator 302. Alternatively, when pot 316 is warm (because pump 312 is regenerating) then pot 315 drives the circulation in dilution refrigerator 302. Condensation surfaces 321 and 322 each correspond to a separate condensation chamber (323 and 324, respectively) in dilution refrigerator 302. Chambers 323 and 324 are connected through tubes 325 and 326, respectively, to stabilizer volume 327 where the two paths are combined before being fed into the heat exchanger 331 and into mixing chamber 328. Otherwise, the operation of dilution refrigerator 302 is similar to that described for dilution refrigerator 202 in FIG. 2, except that tube 329 that connects the still 330 to condensation chambers 323 and 324 branches in two to provide a respective path to each of chambers 323 and 324. Thus, system 300 provides a cryogenic cycle dilution refrigerator that may operate continuously by alternatively pumping and regenerating the two adsorption pumps 311 and 312. A similar continuous cycle dilution refrigerator is described in Sivokon et al., "Operating Features of a Dilution Refrigerator with Condensation Pumping", Low. Temp. Phys. 19(4), April 1993, pp. 312-316.

The present systems, methods and apparatus provide various improvements to prior realizations of continuous cryogenic cycle (pulse tube) dilution refrigerators. While the majority of these improvements are described by themselves, in a "stand-alone" sense, those of skill in the art will appreciate that either all or a subset of the various embodiments described herein may be combined into one refrigeration system.

As shown in FIGS. 1-3, and particularly in FIG. 1B, a cryogenic cycle refrigerator 100b includes at least one adsorption pump 101b connected to an evaporation pot 103b by a hose or tube 102b. Tube 102b includes a condensation region 106b that is thermally coupled to a cold source, such as for example a cold stage of a pulse tube cryo-cooler. As previously described, a main function of condenser 106b is to condense gaseous coolant (e.g., helium) that is desorbed from pump 101b during regeneration of the cryogenic cycle refrigerator 100b. In a continuous cryogenic cycle refrigerator, such as refrigerator 301 from FIG. 3, at least two adsorption pumps 311 and 312 may each be connected to a respective evaporation pot 315 and 316 through a respective hose or tube 313 and 314. Tubes 313 and 314 each include a respective condenser 351 and 352. In typical continuous cryogenic cycle refrigerators, each of condensers 351 and 352 may be coupled in series to a cold source, such as a cold stage of a pulse tube cryo-cooler, through a single heat exchanger. The present systems, methods, and apparatus describe the use of a second, "counter-flow" heat exchanger to improve the efficiency of continuous cryogenic cycle refrigerators.

Figure 4:
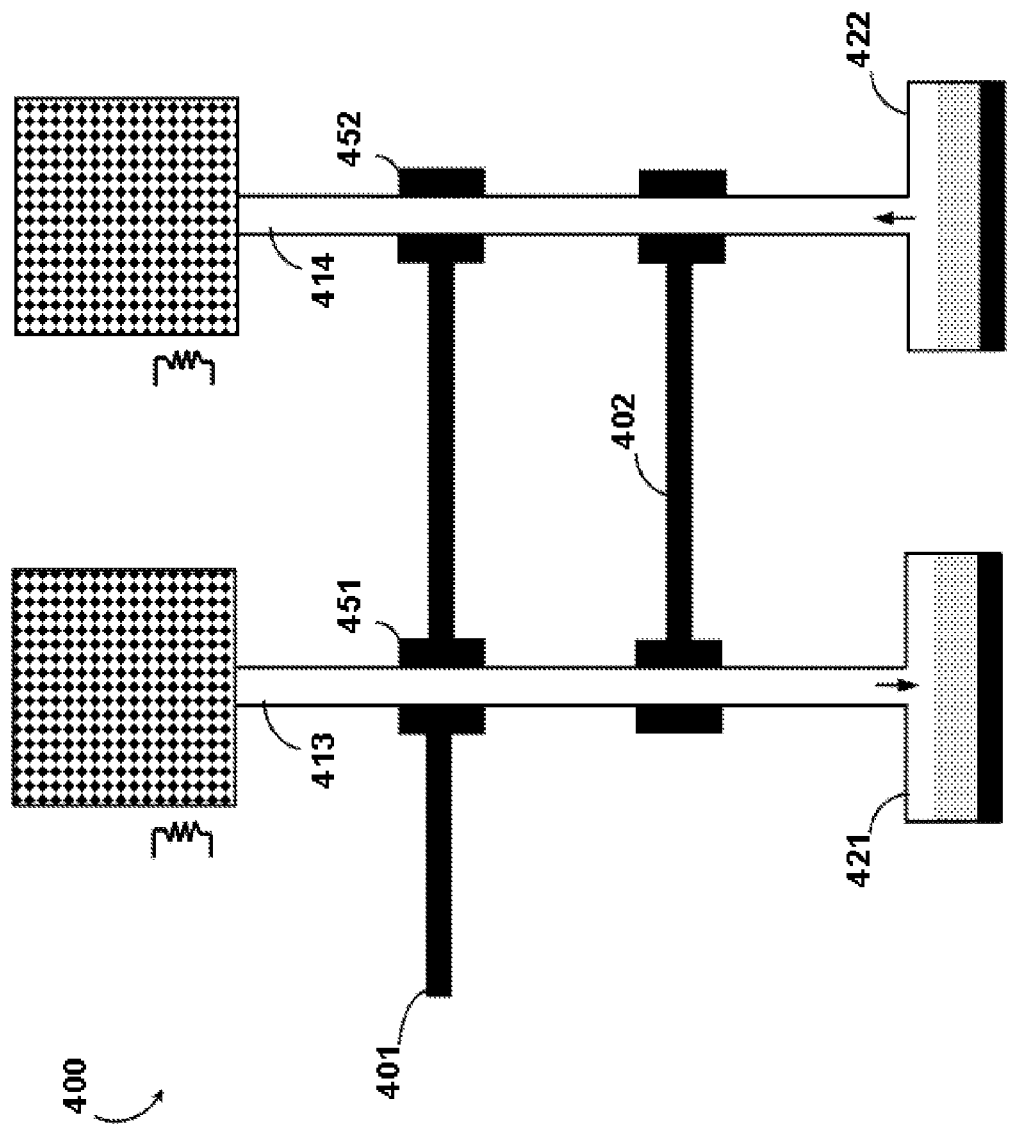
FIG. 4 is a schematic diagram of an embodiment of a continuous cryogenic cycle refrigerator that includes a counter-flow heat exchanger.

FIG. 4 is a schematic diagram of an embodiment of a continuous cryogenic cycle refrigerator 400 that includes a counter-flow heat exchanger 402. Refrigerator 400 is structurally and functionally similar to refrigerator 301 from FIG.

3 and includes two condensers 451 and 452 that are coupled in series to a cold source, such as a cold stage of a pulse tube cryo-cooler (not shown), through a single thermal link 401. However, refrigerator 400 also includes a second, "counter-flow" heat exchanger 402 that provides a thermal link between tubes 413 and 414. In operation, exchanger 402 uses the cold evaporated gas from the "pumping" tube (414 as illustrated in FIG. 4) to help condense the desorbed coolant gas in the "regenerating" tube (413 as illustrated in FIG. 4). Evaporated coolant gas (e.g., helium) in the pumping tube 414 that is leaving the evaporation pot 422 may be colder than the temperature of the first thermal link 401. The evaporation of the coolant gas will already have served to cool evaporation pot 422, and the coolant gas remains cold as it flows through tube 414. Thus, this evaporated gas provides a source of cooling power that is not utilized in prior art realizations of continuous cryogenic cycle refrigerators. Exchanger 402 is designed to take advantage of this cooling power and improve the efficiency of refrigerator 400. In various embodiments of the present systems, methods and apparatus, exchanger 402 may be positioned at any temperature in between the evaporation pot temperature (i.e., ~0.4K) and the temperature of the first thermal link 401 (i.e., ~4K). Those of skill in the art will appreciate that refrigerator 400 may be used to drive circulation in a dilution refrigerator in a similar way to that shown in FIG. 3.

Figure 5:
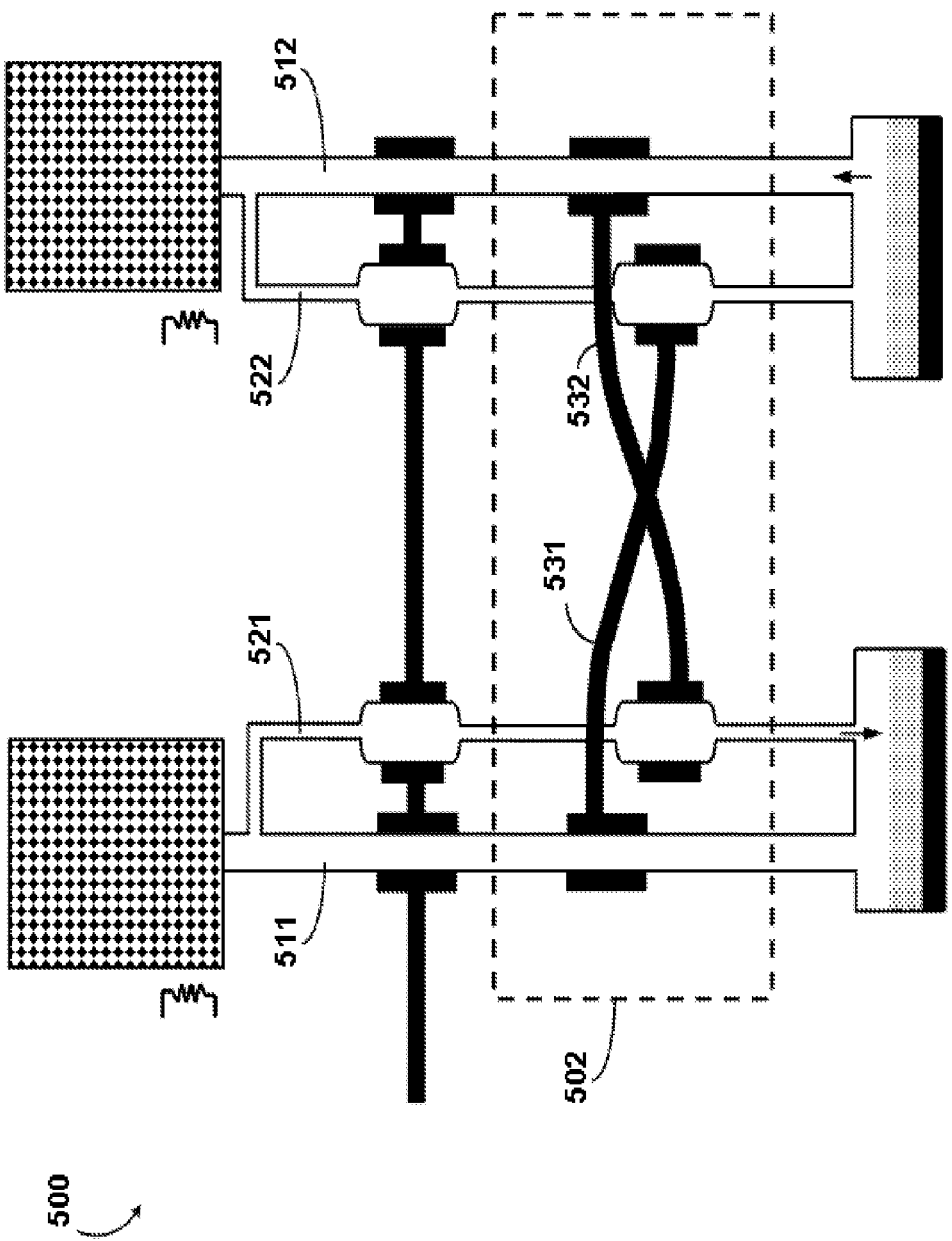
FIG. 5 is a schematic diagram of an embodiment of a continuous cryogenic cycle refrigerator with separate evaporation and cooling paths and a counter-flow heat exchanging system.

In some embodiments, a cryogenic cycle refrigerator may include two tubes providing separate evaporation and condensation paths between an adsorption pump and an evaporation pot, as opposed to a single tube such as tube 102a shown in FIG. 1A. A second, "counter-flow" heat exchanger may also be incorporated in these designs. FIG. 5 is a schematic diagram of an embodiment of a continuous cryogenic cycle refrigerator 500 with separate first and second evaporation paths 511 and 512, respectively, and separate first and second condensation paths 521 and 522, respectively and a counter-flow heat exchanging system 502. In such embodiments, system 502 may include at least two thermal links 531 and 532, where link 531 thermally couples first evaporation path 511 with second condensation path 522, and link 532 thermally couples second evaporation path 512 with first condensation path 521. In this way, when path 512 is "pumping" (as illustrated in FIG. 5), the cooling power of the evaporated gas in path 512 may be used to help condense the desorbed gas in condensation path 521.

In embodiments of cryogenic cycle refrigerators that use $^3$He as the coolant, the condenser (e.g., condenser 106b in FIG. 1B or condensers 351 and 352 in FIG. 3) must be cooled below ~3.3K (the critical temperature for $^3$He) in order to condense gaseous $^3$He to liquid during the regeneration phase. It is possible to provide temperatures this low with a pulse tube cryo-cooler, but there may be very little cooling power left over for cooling things like wires, shields, other system components, and the device to be refrigerated (e.g., the superconducting processor).

Figure 6A:
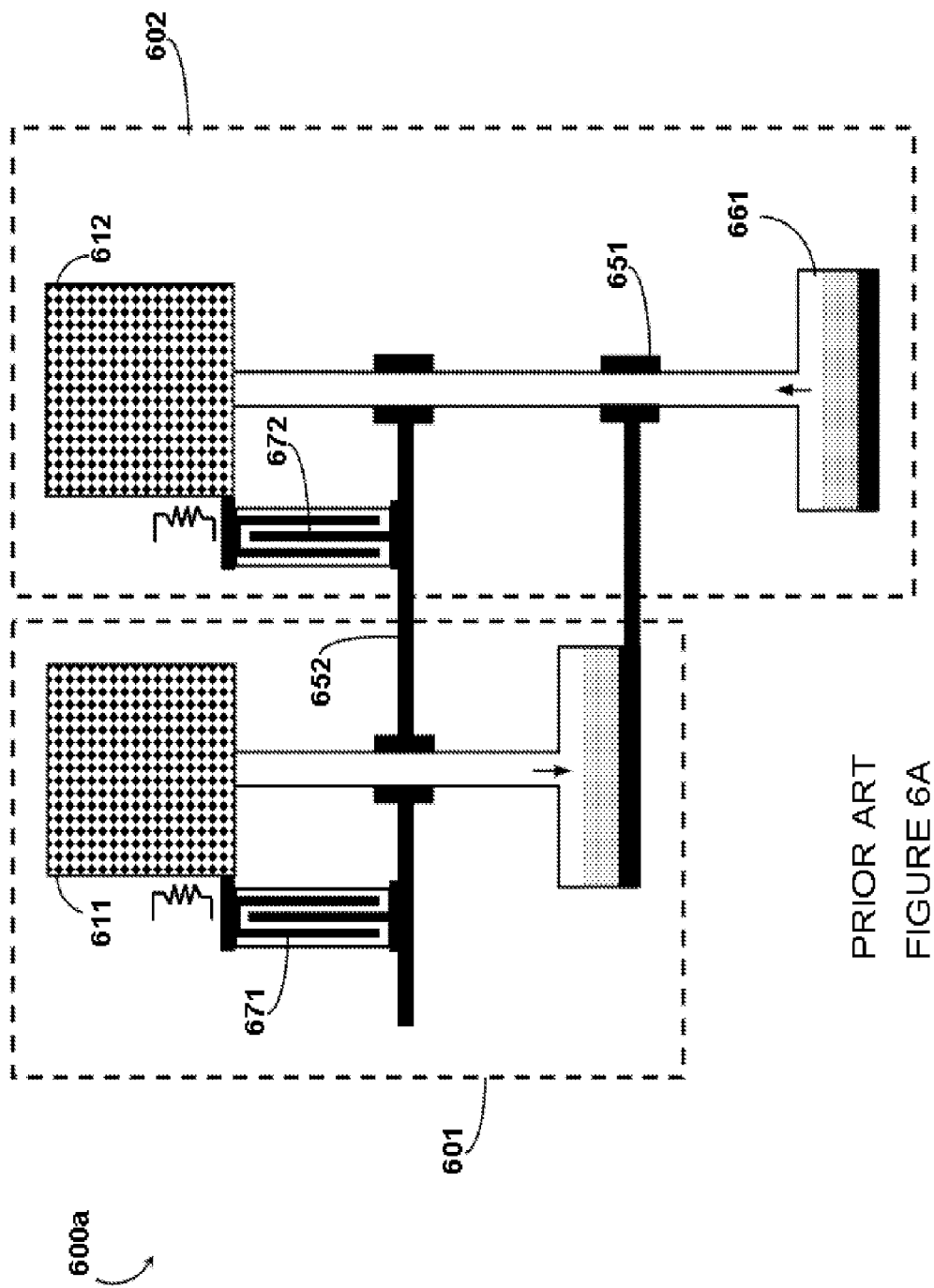
FIG. 6A is a schematic diagram of an embodiment of a typical two-stage adsorption cooling system.

It is possible to realize improved continuous cryogenic cycle (pulse tube) dilution refrigerators by using two-stage adsorption cooling systems. FIG. 6A is a schematic diagram of an embodiment of a typical two-stage adsorption cooling system 600a. The general concept is to use a $^4$He adsorption cooler 601 to provide the condensation temperature for a condenser 651 in a $^3$He adsorption cooler 602. Each of coolers 601 and 602 functions in a similar way to that described for cryogenic cycle refrigerators 100a and 100b in FIGS. 1A and 1B, respectively. Cold plate 652 thermally couples the respective tubes in coolers 601 and 602 in series with a cold source, such as a cold stage of a pulse tube cryo-cooler. In operation, $^4$He adsorption cooler 601 is pumping while $^3$He adsorption cooler 602 is regenerating. In this way, condenser 651 is made cold by cooler 601 and condenser 651 helps to condense desorbed gaseous $^3$He in regenerating cooler 602.

Figure 7:
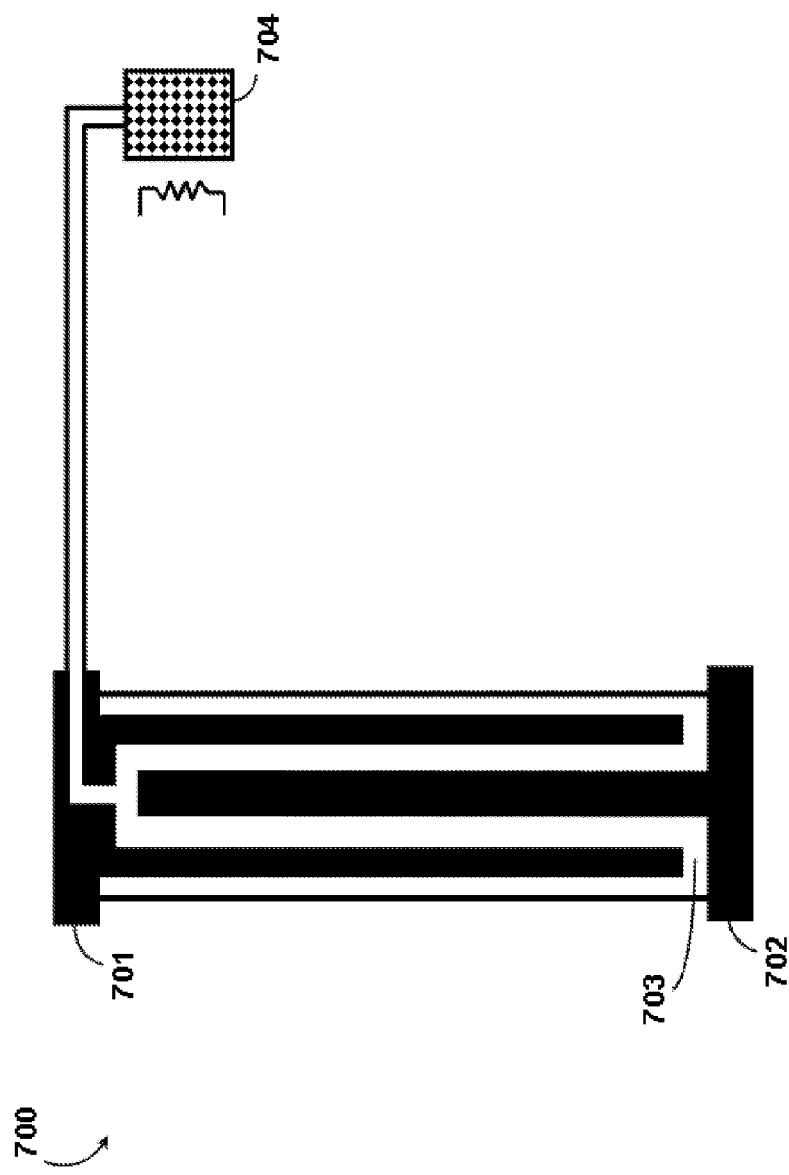
FIG. 7 is a schematic diagram of an embodiment of a typical gas-gap heat switch.

A further aspect of system 600a is the incorporation of gas-gap heat switches ("GGHSs") 671 and 672 into the system. The basic structure and operation of typical GGHSs is known in the art. FIG. 7 is a schematic diagram of an embodiment of a typical GGHS 700. In brief, a GGHS comprises two thermally isolate-able terminals 701 and 702, separated by a vacuum chamber 703. The vacuum chamber 703 is filled with a thermally conductive gas and connected to a controllable pumping means (such as an adsorption pump 704). The gas provides thermal conduction between terminals 701 and 702. However, when pump 704 is activated, the gas is evacuated from chamber 703 and terminals 701 and 702 become effectively thermally isolated from one another. Thus, the GGHS 700 acts as a thermal switch capable of providing thermalization/isolation as needed. For simplicity, the adsorption pump 704 is omitted in the illustrations of the various embodiments of the present systems, methods apparatus that incorporate GGHSs.

Returning to system 600a shown in FIG. 6A, GGHS 671 provides controllable thermalization/isolation between the adsorption pump 611 and cold plate 652. When pump 611 is regenerating (i.e., being heated), it is desirous to isolate pump 611 from the cold source coupled to cold plate 652. Thus, when pump 611 is regenerating, switch 671 is evacuated to block this thermalization path. Conversely, when pump 611 is pumping (i.e., cold), it is necessary to thermally couple pump 611 to the cold source provided by cold plate 652. Thus, when pump 611 is pumping, switch 671 is filled with exchange gas to provide this thermalization path. Similar operation principles apply for pump 612 and switch 672. An example of such a two-stage adsorption cooler is described in Devlin et al., *Cryogenics* 44 (2004), pp. 611-616.

Note that system 600a is inherently a single-shot device, in that pot 661 will be cold while cooler 602 is pumping but will warm up while cooler 602 is regenerating. However, in accordance with the present systems, methods and apparatus, a two-stage adsorption cooling system such as system 600a may be duplicated to provide continuous cryogenic cycle refrigeration in a manner similar to that described for system 300 in FIG. 3. Such a continuous two-stage cryogenic cycle refrigerator incorporates at least two $^4$He adsorption pumps and at least two $^3$He adsorption pumps, giving a total of at least four adsorption pumps.

Figure 6B:
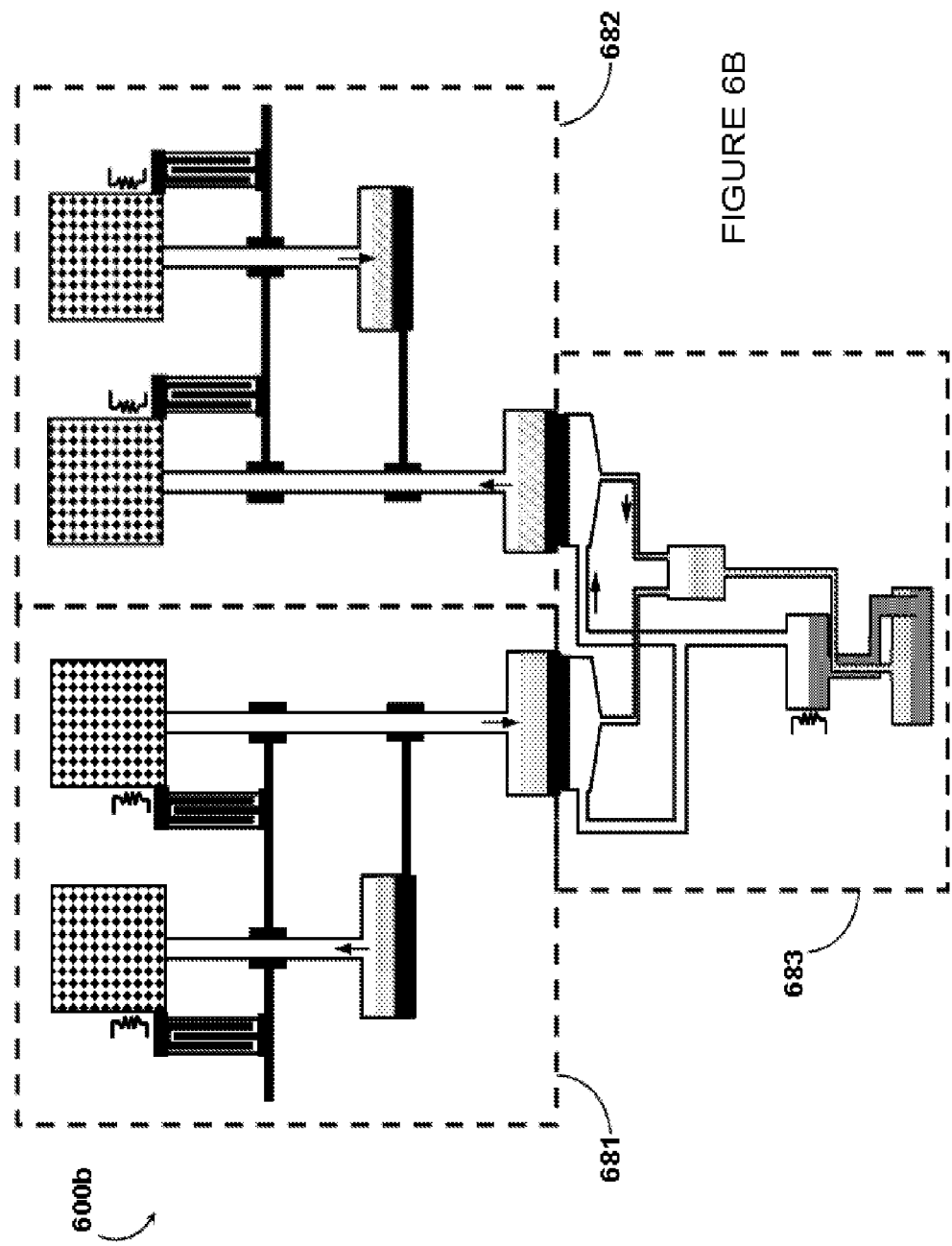
FIG. 6B is a schematic diagram of an embodiment of a continuous two-stage adsorption cooling system.

FIG. 6B is a schematic diagram of an embodiment of a continuous two-stage adsorption cooling system 600b. System 600b includes two two-stage adsorption coolers 681 and 682, each of which functions in a similar way to that described for system 600a in FIG. 6A. In operation, while one of coolers 681 and 682 is pumping, the other may be regenerating. Thus, system 600b may provide continuous cryogenic refrigeration similar to that realized by system 300 in FIG. 3. In some embodiments, each of coolers 681 and 682 may be thermally coupled to a dilution refrigerator 683, such that the continuous cryogenic refrigeration provided by the combination of coolers 681 and 682 provides cooling power that at least partially drives the dilution refrigerator 683.

Figure 8:
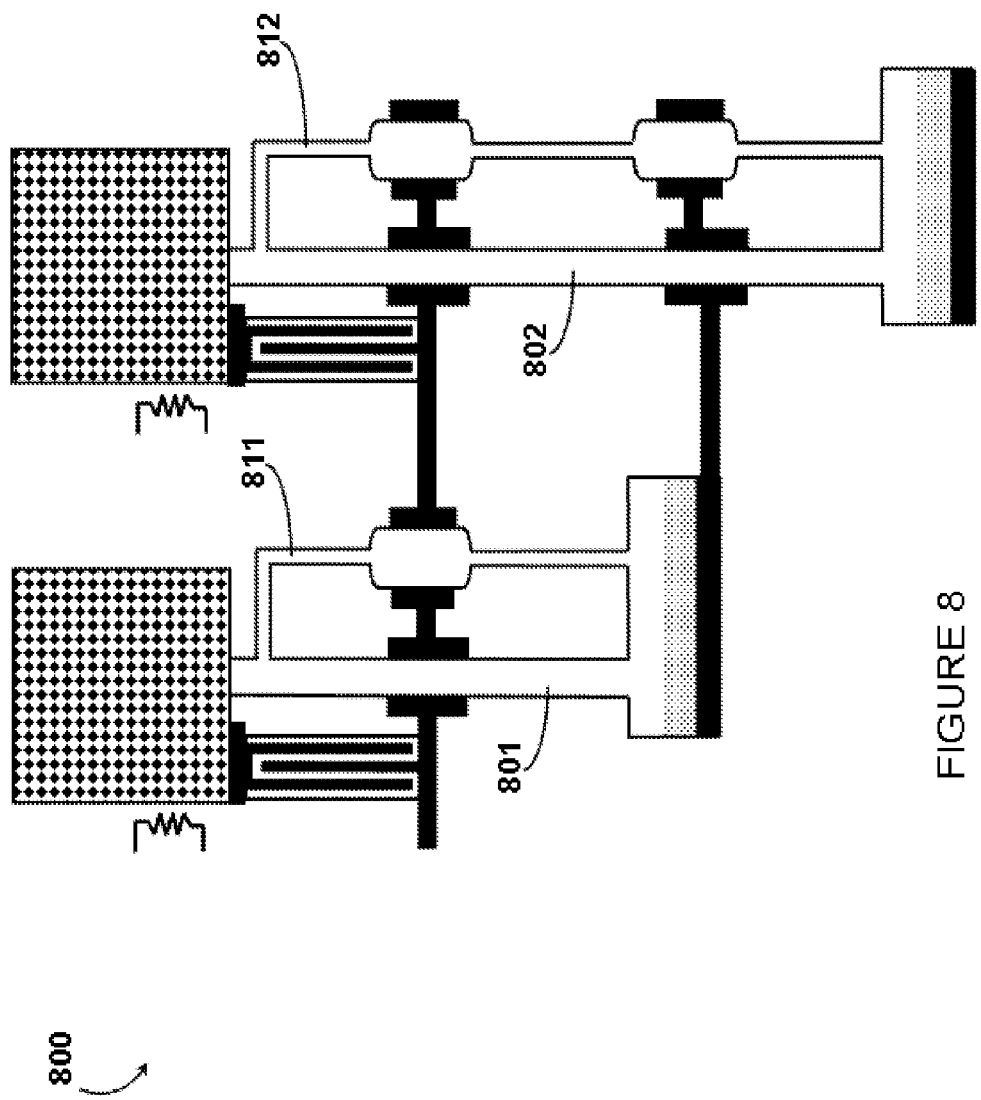
FIG. 8 is a schematic diagram of an embodiment of a two-stage adsorption cooling system with separate evaporation and condensation paths.

The present systems, methods and apparatus, provide improvements to typical two-stage adsorption cooling system designs. One such improvement is to incorporate separate evaporation and condensation paths into the two-stage adsorption cooling system. FIG. 8 is a schematic diagram of an embodiment of a two-stage adsorption cooling system 800 with separate evaporation paths 801, 802 and condensation paths 811, 812. System 800 functions in a similar manner to that described for system 600*a* in FIG. 6A, except that separate paths are provided for evaporation and condensation (as in refrigerator 500 shown in FIG. 5). The evaporation paths 801 and 802 have lower impedance than the condensation paths 811 and 812 and therefore evaporated gas preferentially uses the evaporation paths 801 and 802 during pumping. However, the condensation paths 811 and 812 are selectively thermally couple-able to the cold source (such as a cold stage of a pulse tube cryo-cooler) and can therefore be made colder than the evaporation paths 801 and 802. During regeneration, desorbed gas will preferentially use the condensation paths 811 and 812 due to the influence of cryo-pumping. Having separate evaporation and condensation path in two-stage adsorption cooling system 800 can be advantageous over prior art designs because it allows the requirements for evaporation and condensation to be treated separate from one another. For example, efficient condensation can be realized without hindering the pumping path by the addition of higher-impedance features.

A second improvement to the typical two-stage adsorption cooling system shown in FIG. 6A relates to reducing the regeneration time of the multiple adsorption pumps being implemented. Recall that a continuous two-stage adsorption cooling system requires at least four adsorption pumps. The incorporation of so many pumps into a system inevitably leads to challenges in rapidly regenerating each pump and synchronizing regeneration schedules with pumping schedules. According to the present systems, methods and apparatus, the continuous cooling power of an adsorption-pumped system may be increased by reducing the heat capacity of the adsorption pumps. The heat capacity of each adsorption pump is largely determined by the mass of the containers used for their construction. The mass of these containers is partly determined by the need to safely contain the volume of coolant (e.g., helium) gas. During normal operation of the adsorption pumps (i.e., at cryogenic temperatures), the pressure of this gas never exceeds about 2 atmospheres, which is easily contained in a rather light-weight and correspondingly low heat capacity housing. However, when the system is not in operation (such as, for example, when maintenance is required) it may be warmed to room temperature and the pressure can easily exceed 100 atmospheres. As a consequence, the housing containing each adsorption pump is typically heavy weight (high heat capacity) to prevent catastrophic failure of the container. By using at least one low-volume capillary tube between an adsorption pump and a larger-volume reservoir, a system may be realized where a non-cryogenic (e.g., room-temperature) valve may be used to safely allow a portion of the gas in an adsorption pump to expand into a reservoir at low pressure when the system is warm. When the system is cooled for operation, the gas may be condensed into the adsorption pump(s) at low pressure and the room-temperature valves may be sealed to allow normal operation of the fridge. A further safety measure is provided by using a solenoid valve for this isolation valve, arranged in a configuration where an inadvertent warming of the system would "push open" the normally-closed solenoid valve in the event of an overpressure condition, such as during a power failure. The volume of the low-volume capillary tube should be small enough so as not to adversely affect the performance of the adsorption cooler. Using a non-cryogenic valve for this purpose greatly increases reliability. Those of skill in the art will appreciate that an adsorption system incorporating a non-cryogenic reservoir may be implemented in conjunction with any of the embodiments described in the present systems, methods and apparatus. This scheme is pointed out as being particularly useful in two-stage adsorption cooling systems only because pump regeneration time may be a particular issue in these designs; however, the benefits of a non-cryogenic reservoir may still be advantageous in other adsorption cooler designs.

Figure 9:
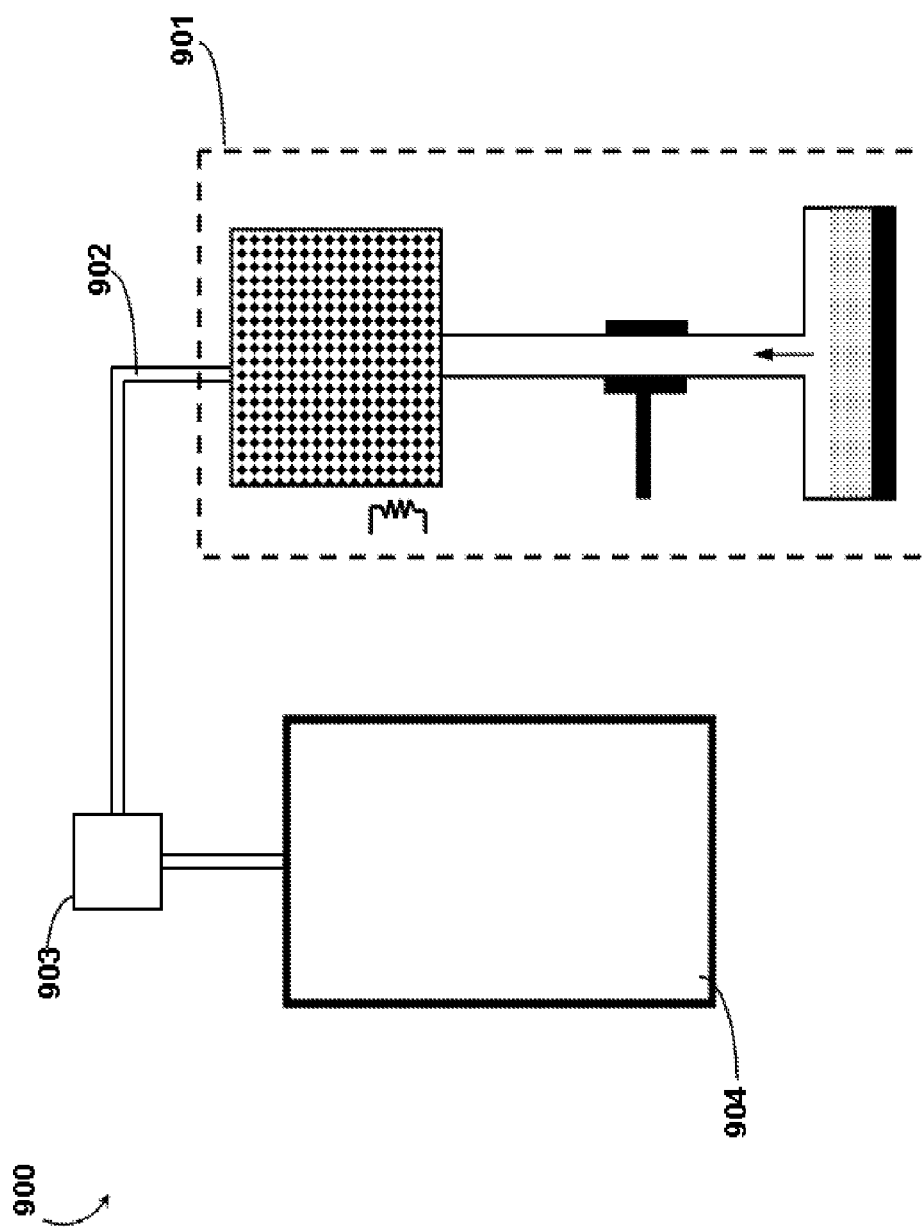
FIG. 9 is a schematic diagram of an embodiment of a refrigeration system including an adsorption cooler connected to a non-cryogenic reservoir through a low-volume capillary tube.

FIG. 9 is a schematic diagram of an embodiment of refrigeration system 900 including an adsorption cooler 901 connected to a non-cryogenic reservoir 904 through a low-volume capillary tube 902. Capillary tube 902 is interrupted by a room-temperature valve 903, which may include a solenoid valve. As previously described, reservoir 904 (shown with extra-thick walls) may be used to store coolant gas (e.g., helium) from adsorption cooler 901 when cooler 901 is warmed above cryogenic temperature. This functionality allows adsorption cooler 901 to be formed by lighter-mass materials, as cooler 901 is no longer required to bear the increased pressure of its gaseous contents when warmed above cryogenic temperatures. Thus, system 900 provides faster cool-down and a more efficient use of cooling power.

In other embodiments, connecting a non-cryogenic reservoir 904 to an adsorption cooler 901 through a low-volume capillary tube 902 may realize an alternative advantage. In general, the length of time for which an adsorption cooler may remain in its pumping state is influenced by the amount of liquid coolant in the pot (such as pot 103*a* in FIG. 1A). This "pot lifetime" is influenced by the temperature of the condenser (such as condenser 106*b* in FIG. 1B). In embodiments where the attainable condenser temperature is limited to a range above ~1K, the pot lifetime rapidly decreases as a function of the condenser temperature. However, in accordance with the present systems, methods and apparatus the pot lifetime in this temperature range may be improved by increasing the pressure in the adsorption cooler system. Pressure may be increased by filling the adsorption cooler system with a greater quantity of gaseous coolant. However, in order to provide increased pressure at operating temperatures (i.e., cryogenic temperatures), impractically high pressures may need to be introduced at room-temperature. Thus, a refrigeration system such as system 900 shown in FIG. 9 may be implemented to provide increased operating pressure at cryogenic temperature and to provide more practical pressures as the system is warmed up. At approximately room temperature, reservoir 904 may contain gaseous coolant (e.g., helium) under relatively high pressure and, by operating valve 903, this gaseous coolant may be controllably released into adsorption cooler 901 at cryogenic temperature until a desired pressure level is realized within cooler 901. Similarly, while cooler 901 is warmed up (e.g., for maintenance, or simply to be deactivated) valve 903 may be operated to controllably release gaseous coolant into reservoir 904 to reduce the growing pressure in cooler 901.

Those of skill in the art will appreciate that, while capillary tube 902 is illustrated in FIG. 9 as being connected to the adsorption pump of cooler 901, in alternative embodiments capillary tube 902 may similarly be connected to the tubular passage or the evaporation pot of cooler 901.

The present systems, methods and apparatus describe a novel application of gas-gap heat switch (GGHS) technology in adsorption-pumped refrigeration systems. A typical GGHS (as illustrated in FIG. 7) is realized by a discrete, stand-alone unit that thermally connects to the appropriate components in the refrigeration system. In accordance with the present systems, methods and apparatus, a GGHS may be integrated into the specific elements that are to be thermally switched within the refrigeration system. By integrating a GGHS into system components, higher thermal conductance can be realized while the volume, thermal mass, and switching time may all be reduced.

Figure 10:
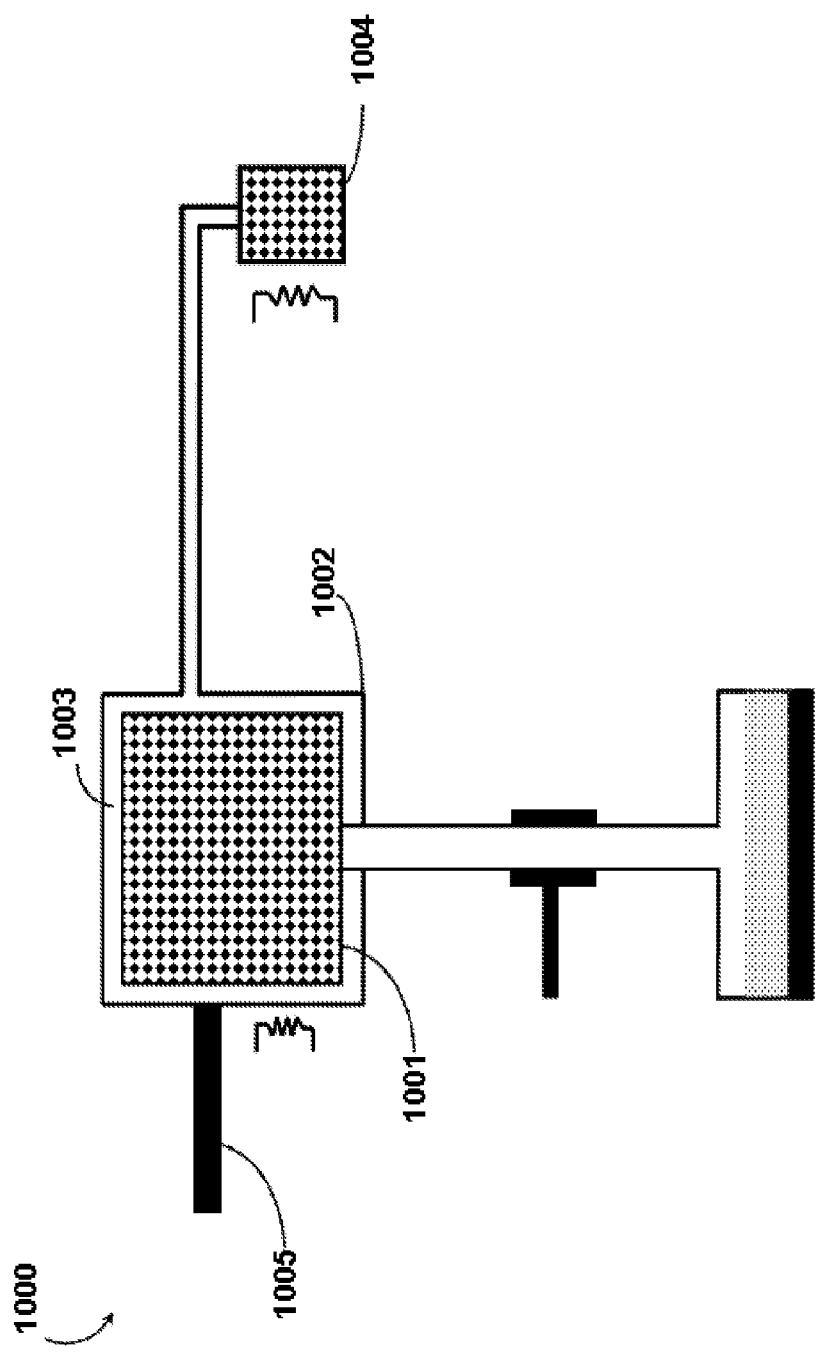
FIG. 10 is a schematic diagram of an embodiment of an adsorption cooler that includes an adsorption pump with integrated gas-gap heat switch.

An example of how a GGHS may be integrated into a system component is shown in FIG. 10. FIG. 10 is a schematic diagram of an embodiment of an adsorption cooler 1000 that includes an adsorption pump 1001 with integrated GGHS 1002. GGHS 1002 functions in a similar way to that described for GGHS 700 in FIG. 7, but structurally GGHS 1002 is integrated into the structure of adsorption pump 1001. A first terminal of GGHS 1002 is realized by the outer wall of GGHS 1002. A second terminal of GGHS 1002 is realized by the outer wall of adsorption pump 1001, which is separated from the outer wall of GGHS 1002 by a vacuum chamber 1003. Chamber 1003 may be controllably evacuated by a second adsorption pump 1004. Lastly, the outer wall of GGHS 1002 may be thermally coupled through a thermal link 1005 to a cold source (such as a cold stage of a pulse tube cryo-cooler) such that when pump 1004 is deactivated and chamber 1003 is filled with thermally conductive gas, cooling power is transferred to adsorption pump 1001 by the cold source.

An adsorption compressor system with an integrated GGHS is described in Burger et al., "165K Microcooler Operating with a Sorption Compressor and a Micromachined Cold Stage", *Cryocoolers* 11 (2001), pp. 551-560. While conceptually similar in some respects, these "integrated" GGHSs are designed for use in completely different applications than those described in the present systems, methods and apparatus.

Figure 11:
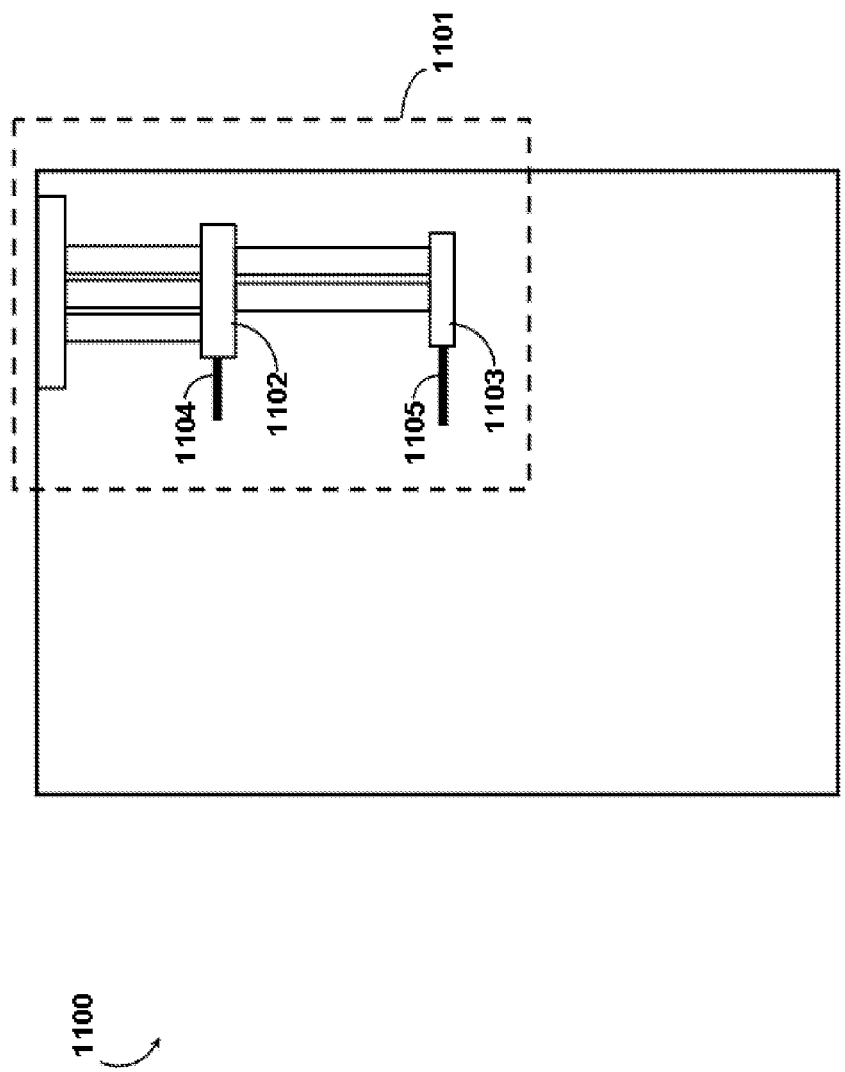
FIG. 11 is a schematic diagram of an embodiment of a typical two-stage cold head from a pulse tube cryo-cooler.

The present systems, methods and apparatus describe improvements to typical pulse tube cryo-cooler designs. These improvements may be implemented in a broad range of applications and are particularly advantageous in CCCPTDR designs. A typical pulse tube cryo-cooler provides cooling power in the form of a "cold head." This cold head typically protrudes into an internal vacuum chamber within which the device(s) to be cooled are contained. The device(s) to be cooled are thermally coupled, either directly or indirectly, to the cold head. A typical pulse tube cryo-cooler includes a two-stage cold head. FIG. 11 is a schematic diagram of an embodiment of a typical two-stage cold head 1101 in a pulse tube cryo-cooler 1100. Cold head 1101 includes two stages 1102 and 1103, each of which provides an approximately set temperature level. For instance, stage 1102 may be at a temperature of ~40K and stage 1103 may be at a temperature of ~3K. Stage 1102 may be thermally coupled to an appropriate component inside cryo-cooler 1100 by thermal link 1104. Similarly, stage 1103 may be thermally coupled to an appropriate component inside cryo-cooler 1100 by thermal link 1105. Thus, cold head 1101 provides two points 1102 and 1103 at which a thermal link may be established, each at a different temperature with a corresponding cooling power.

In order to condense $^3$He into liquid during the regeneration phase of an adsorption cooler, the condenser must be below ~3.3K. It is possible to provide temperatures this low with a typical two-stage pulse tube cryo-cooler, but there is very little cooling power at this temperature. Typically, adding heat loads to the pulse tube second stage (1103 in FIG. 11) is required to operate adsorption cooler(s) and results in an increase in the temperature of that stage. Thus, cooling power that is required to condense helium below ~3.3K is no longer available once these other heat loads are added. In accordance with the present systems, methods, and apparatus, a pulse tube cryo-cooler may be designed to include a cold head with more than two points at which a thermal link may be established, again with each point corresponding to different temperature and cooling power. A cold head with at least a third thermal linking-point provides a degree of customizability and flexibility in adsorption cooling systems that has previously not been realized in the art.

In addition to the first-stage cooling power typically required for shielding and wiring, a CCCPTDR using adsorption coolers may benefit from the provision of cooling power at two additional operating temperatures instead of the single operating temperature typically available at the second stage of a two-stage pulse tube cryo-cooler. In order to thermally cycle $^3$He adsorption coolers (using, for example, charcoal as the adsorbent material) and to pre-cool desorbed gas from regenerating adsorption pumps, a significant amount of cooling power is desired at around 7K to 10K. Also, condensing $^3$He at ~2.8K requires far less cooling power when the $^3$He has already been pre-cooled to around 7K as opposed to trying to cool directly from the regeneration temperature of the adsorption pumps (typically ~20K or ~40K) down to 2.8K. In accordance with the present systems, methods and apparatus, adding a thermal-linking point at an intermediate temperature cooling stage to the pulse tube cold head between the first stage 1102 and second stage 1103 can contribute a significant amount of cooling power for pre-cooling, thereby reducing the required cooling power at the second stage 1103.

Figure 12:
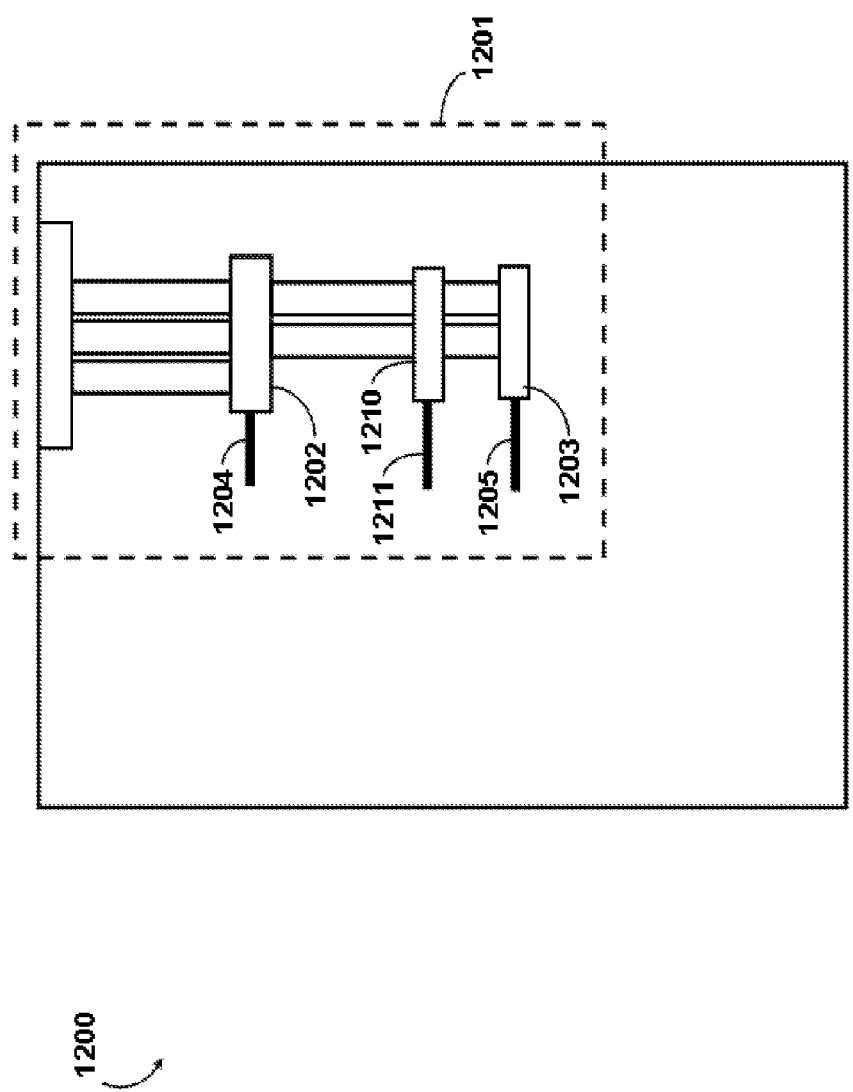
FIG. 12 is a schematic diagram of an embodiment of a pulse tube cryo-cooler with a cold head having more than two thermal-linking points.

FIG. 12 is a schematic diagram of an embodiment of a pulse tube cryo-cooler 1200 with a cold head 1201 having more than two thermal-linking points. Cryo-cooler 1200 includes three thermal-linking points 1202, 1203, and 1210, though those of skill in the art will appreciate that any number of thermal-linking points may be implemented. The three thermal-linking points in cryo-cooler 1200 include first stage 1202, second stage 1203, and intermediate linking point 1210. Various components of the CCCPTDR requiring cooling may be coupled through a thermal link (1204, 1205, and 1211, respectively) to an appropriate linking point 1202, 1203, and 1210. Intermediate linking point 1210 may supply sufficient pre-cooling power, and cooling power for cycling the adsorption pumps, such that the demands on the second stage 1203 are reduced, allowing a temperature at the second stage 1203 of around 2.8K. A second stage temperature this low allows direct condensation using $^3$He adsorption coolers and ultimately leads to much higher available cooling power for the device to be refrigerated. The incorporation of an intermediate thermal-linking point 1210 can simplify the system dramatically by reducing size, thermal mass and cost, and increasing the overall reliability. In some embodiments, the intermediate linking point may be discrete and localized (substantially at one temperature) as represented by stage 1210 in FIG. 12. In other embodiments, the intermediate cooling stage may be a continuous heat exchanger, thermally contacting a longer length of the pulse tube cold head between the first stage 1202 and the second stage 1203 and providing a range of operating temperatures and cooling powers. Furthermore, those of skill in the art will appreciate that the thermal-linking points may or may not correspond to actual internal pulse tube cooling stages in alternative embodiments.

The present systems, methods and apparatus describe improvements to typical coolant (e.g., helium) evaporation pot designs. In regeneration of an adsorption cooler, the evaporation pot, such as pot 661 shown in FIG. 6A, provides a reservoir into which liquid coolant is deposited under the influence of gravity as it condenses. In pumping of an adsorption cooler, the evaporation pot provides a supply of liquid coolant that is evaporated by the pumping action, cooling the remaining liquid in the pot, and thereby cooling the pot itself. The thermal exchange between the coolant (e.g., helium) and the pot structure can be improved such that the available cooling power at the pot is increased. A known way to improve this thermal exchange is to drill holes in the pot structure. In the approaches known in the art, a large number of small holes are typically drilled into the bottom surface of the evaporation pot; however, there are certain disadvantages to this approach. One such disadvantage is that a large number of small holes can increase the impedance of the gaseous coolant and thereby reduce pumping efficiency. Another such disadvantage is that a large number of small holes can result in an uneven distribution of liquid coolant in the reservoir and consequently uneven cooling of the pot. This latter disadvantage is accentuated by the fact that the rate of condensation into, and the rate of evaporation rate out of, each hole may depend on the position of the hole in the pot. In general, liquid coolant may drip into, or evaporate out from, holes that are situated directly beneath the tubular passage more readily than to/from holes that are further away from the tubular passage.

Figure 13B:
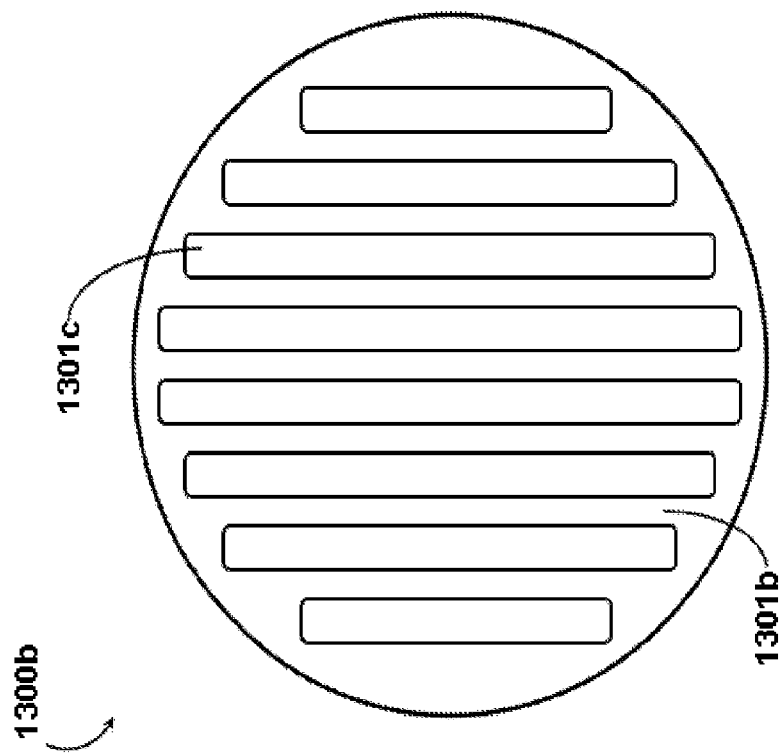
FIG. 13B is a top plan view of the bottom internal surface of an embodiment of an improved evaporation pot for use with an adsorption cooler.
Figure 13A:
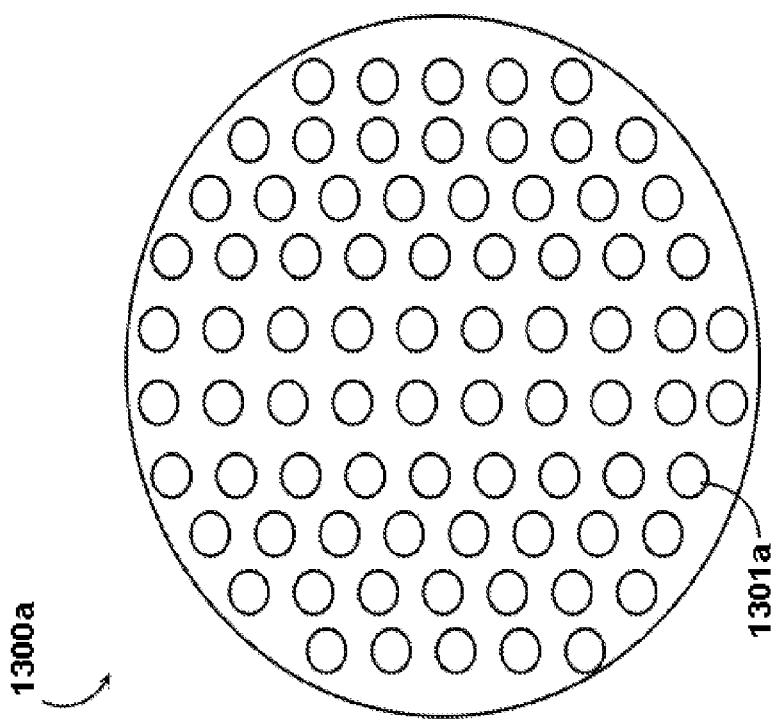
FIG. 13A is a top plan view of the bottom internal surface of an embodiment of a typical evaporation pot for use with an adsorption cooler.

FIG. 13A is a top plan view of the bottom internal surface of an embodiment of a typical evaporation pot 1300*a* for use with an adsorption cooler. The bottom internal surface of pot 1300*a* includes a relatively large number of small holes 1301*a* (only one called out in FIG. 13A) which do not pass all the way through the surface but rather extend a portion of the way into the volume of the bottom internal surface of pot 1301*a*. As previously discussed, a first disadvantage of these holes is that their relatively small aperture size may increase the impedance of gaseous coolant in the pot. A second disadvantage of these holes is that, because they are isolated from one another, each hole may end up containing a different quantity of liquid coolant, resulting in uneven cooling of pot 1300*a*.

FIG. 13B is a top plan view of the bottom internal surface of an embodiment of an improved evaporation pot 1300*b* for use with an adsorption cooler. The bottom internal surface of pot 1300*b* includes a relatively small number of elongated slots 1301*b* (only one called out in FIG. 13B) which do not pass all the way through the surface but rather extend a portion of the way into the volume of the bottom internal surface of pot 1301*b*. The elongated slots 1301*b* in FIG. 13B can be advantageous over the small holes 1301*a* in FIG. 13A because they provide a larger aperture size that has a smaller impact on the impedance of gaseous coolant in the pot. Furthermore, each elongated slot 1301*b* effectively realizes a plurality of small holes 1301*a* that have been coupled together so that the level of liquid is the same throughout. This effect can be further improved by ensuring that all or some of the elongated slots 1301*b* are connected, as illustrated in FIG. 13B. Thus, elongated slots 1301*b* can improve the cooling of evaporation pot 1300*b*. Those of skill in the art will appreciate that, while elongated slots 1301*b* are illustrated in FIG. 13B as generally rectangular with rounded or chamfered corners, other geometries (such as rectangles with sharp corners or ovals) may similarly be used. Similarly, while slots 1301*b* are shown in parallel alignment in FIG. 13B, in alternative embodiments the elongated slots may be arranged in alternative ways. For example, in some embodiments the elongated slots 1301*b* may be arranged radially, substantially radially, or in a grid-like fashion.

In alternative embodiments, the advantages provided by elongated slot arrangements may similarly be realized by the implementation of protrusions or projections from the bottom surface of the evaporation pot. The top plan view of the bottom internal surface of an embodiment of such an improved evaporation pot may be similar to that shown in FIG. 13B; however, conceptually the structure may be different. Rather than providing "elongated slots" 1301*b* in the bottom internal surface of pot 1300*b*, protrusions 1301*c* may be implemented to the same effect. Protrusions 1301*c* may be fin-like projections that extend upwards from the bottom internal surface of pot 1300*b*. Those of skill in the art will appreciate that, in alternative embodiments, protrusions 1301*c* may be arranged in alternative ways, such as a radial pattern or a grid-like fashion.

Another disadvantage in typical evaporation pot designs is that they do not account for the fact that the rate of evaporation from any given hole inside that pot may be influenced by that hole's proximity to the evaporation tube. Since the evaporation tube (such as tube 102*a* in FIG. 1A) is typically positioned near the center of the pot, liquid contained in those holes nearest the center of the bottom internal surface of the pot may evaporate more readily than liquid contained in other holes. This effect can result in uneven cooling of the evaporation pot. In accordance with the present systems, methods and apparatus, an additional or alternative modification may be made to typical evaporation pot designs in order to reduce the negative impacts of this effect.

Figure 14:
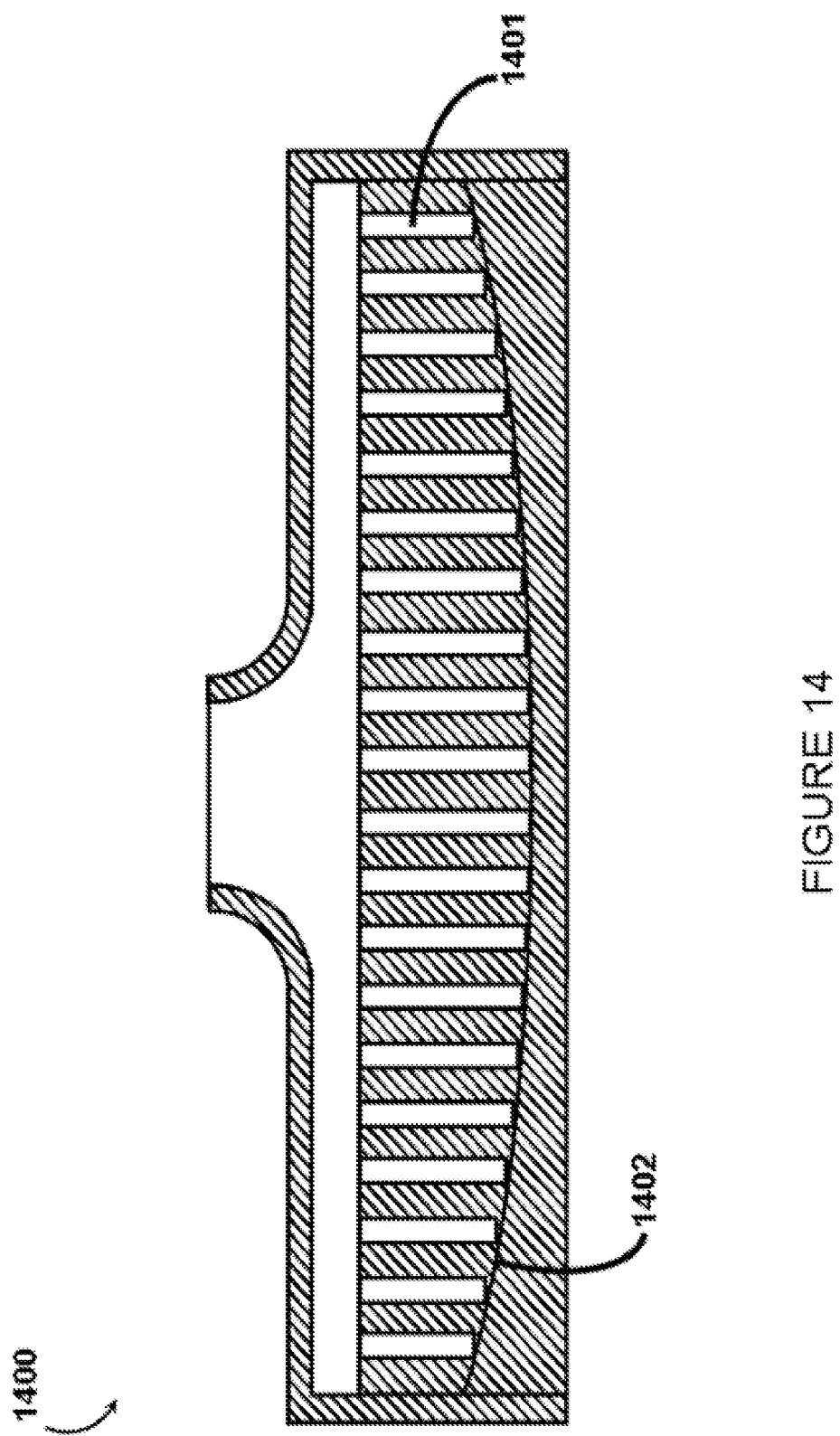
FIG. 14 is a cross-sectional view of an embodiment of an evaporation pot for use with an adsorption cooler.

FIG. 14 is a cross-sectional view of an embodiment of an evaporation pot 1400 for use with an adsorption cooler. In pot 1400, the respective depth of each of the holes 1401 is tailored in relation to the relative rate of evaporation from that position. Because the highest rate of evaporation is typically seen near the center of pot 1400, the holes are deepest near the center of pot 1400 and shallowest near the edges of pot 1400. In some embodiments, the relative depths of holes 1401 may follow a slope given by the line 1402 drawn in FIG. 14. Alternatively or additionally, a diameter width and/or length of the holes may vary based on the relative rate of evaporation, based, for example, on the position of the respective hole relative to the position of the evaporation tube.

In typical adsorption cooler designs such as those shown in FIGS. 1-3, the flow of coolant (e.g., helium) is guided by hoses and/or tubes that are each comprised of a single channel. In the case of a condensation path, where cooling power is transferred through the walls of the tube, a single-channel tube provides a relatively low ratio of surface area to cross-sectional area. In accordance with the present systems, methods and apparatus, the surface area to cross-sectional area ratio of a condensation path may be improved by implementing hoses/tubes with multiple channels as opposed to a single channel. The multi-channel design has the advantage over single channel designs in that an equivalent amount of thermal exchange can be achieved with a shorter condenser or pre-cooler section. This reduces the dead volumes in the adsorption cooler and hence increases the cycling efficiency of the cooler. The size of the channels may be made large enough to ensure that the pumping impedance is not too high; otherwise, the cooling performance would be adversely affected.

Figure 15:
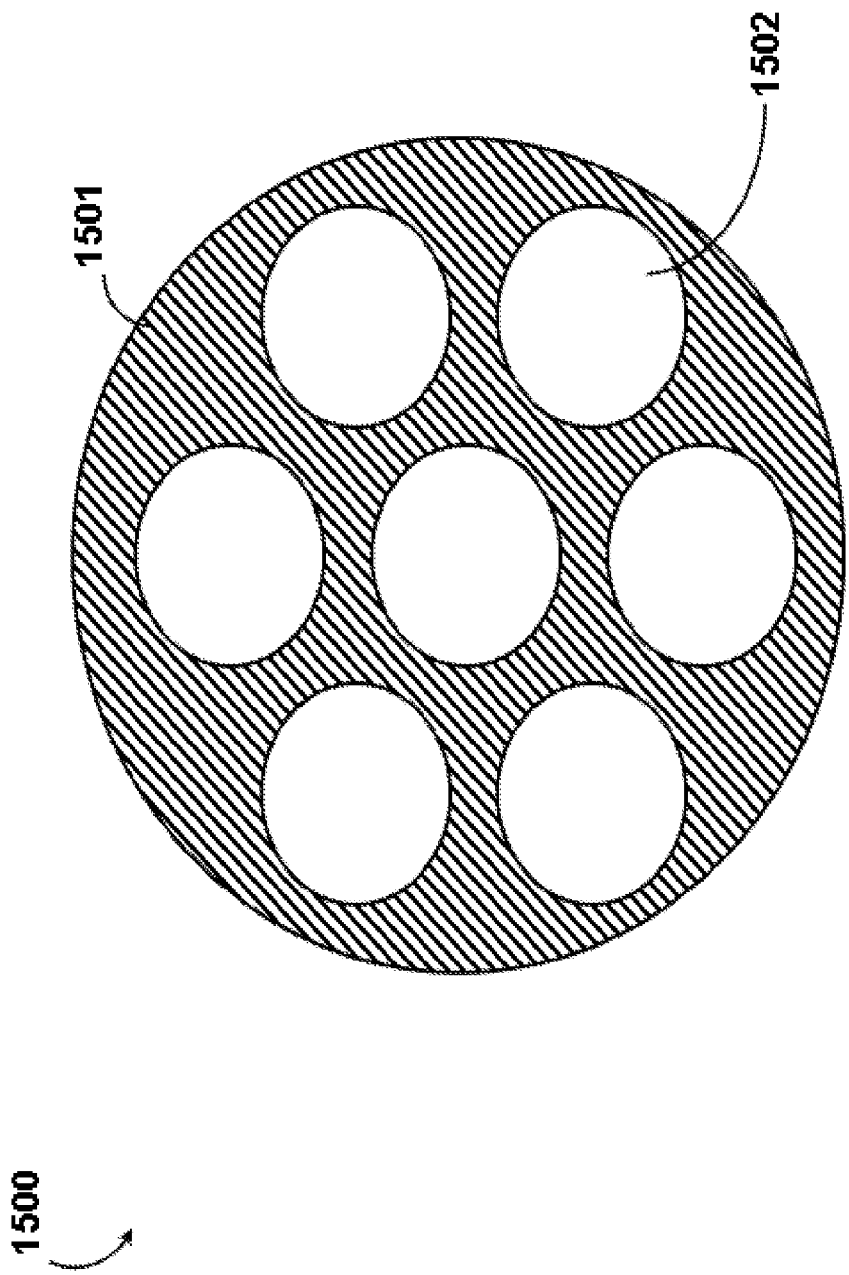
FIG. 15 is a cross-sectional view of an embodiment of a multi-channel tube for use in the condensation path of an adsorption cooler.

FIG. 15 is a cross-sectional view of an embodiment of a multi-channel tube 1500 for use in the condensation path of an adsorption cooler. Tube 1500 comprises a plurality of passages 1502 (only one called out in FIG. 15) traversing through the volume of a single tube material 1501. Those of skill in the art will appreciate that while both tube 1500 and passages 1502 are illustrated in FIG. 15 as having circular cross-sectional area, other geometries (such as squares and rectangles) may be used. Similarly, while the illustrated embodiment includes seven passages 1502, those of skill in the art will appreciate that any number of passages may be implemented.

In accordance with the present systems, methods and apparatus, the performance of adsorption coolers may be improved by including a regenerative material in a shared evaporation/condensation tube (such as tube 102*a* in FIG.

1A). A regenerative material is a material having a comparatively high heat capacity at low temperatures (typical volumetric specific heat>~0.5 J/Kcm$^3$ at ~4K). In the present systems, methods and apparatus, the regenerative material may be used to capture cooling enthalpy that is otherwise wasted during the pumping cycle and to reuse it for condensing during the condensation/regeneration cycle. An example of a regenerative material is the ceramic GdAlO$_3$. This technique is used in the art (see, for example, L. M. Qui et al., Cryogenics 41 (2001), pp. 693-696) to improve cryo-cooler designs, but this disclosure represents the first description of its implementation to improve the performance of adsorption coolers.

Figure 16:
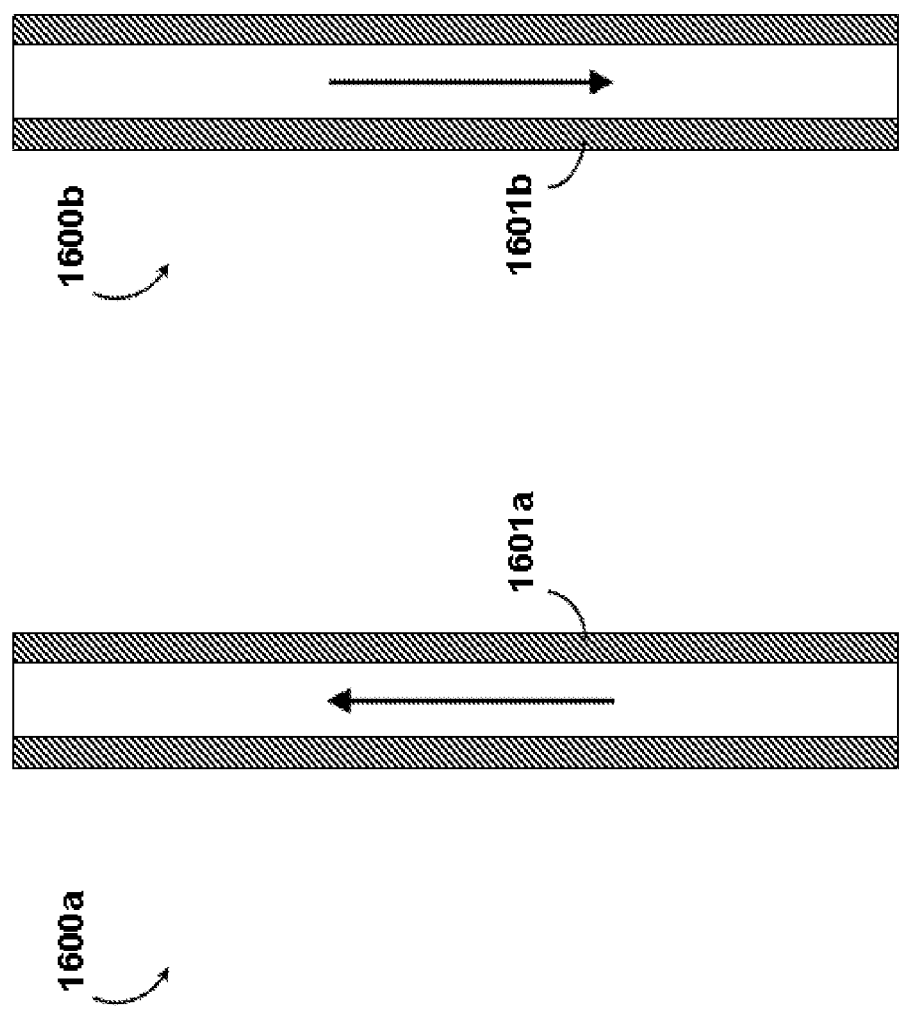
FIG. 16A is a schematic diagram of an embodiment of a regenerative pumping tube for use with an adsorption cooler, where the adsorption cooler is in its pumping state.
FIG. 16B is a schematic diagram of an embodiment of a regenerative pumping tube for use with an adsorption cooler, where the adsorption cooler is in its regenerating state.

FIG. 16A is a schematic diagram of an embodiment of a regenerative pumping tube 1600a for use with an adsorption cooler, where the adsorption cooler (not shown) is in its pumping state. Because the adsorption cooler is pumping, gaseous coolant (e.g., helium) is pumped up through tube 1600a in the direction of the illustrated arrow. The upward flow of gaseous coolant reduces the pressure in the pot at the base of the tube (not shown), causing more coolant to evaporate. In typical adsorption coolers, the motivation for inducing the evaporation of coolant is that the evaporation process causes the remaining liquid to cool down. The resulting evaporated coolant is typically pumped away to induce further evaporation. However, the evaporated coolant is cold, and represents a source of cooling power that is not fully utilized in conventional adsorption coolers. In accordance with the present systems, methods and apparatus, a regenerative material (such as GdAlO$_3$) may be included in the walls 1601a of pumping tube 1600a such that the walls 1601a of pumping tube 1600a are cooled by the passage of evaporated coolant during pumping and retain at least a portion of this cooling to provide a source of cooling power during the regeneration phase of the adsorption pump.

FIG. 16B is a schematic diagram of an embodiment of a regenerative pumping tube 1600b for use with an adsorption cooler, where the adsorption cooler (not shown) is in its regenerating state. The walls 1601b of tube 1600b include a regenerative material that has, during the pumping phase, been cooled by the passage of evaporated coolant. Thus, during the regeneration phase shown in FIG. 16B, desorbed gaseous coolant that flows through tube 1600b in the direction of the illustrated arrow is at least partially cooled by the cooling power retained in the regenerative material in the tube walls 1601b. This cooling may help in condensing the desorbed gaseous coolant. Thus, by including regenerative material in the walls 1601b of the pumping tube, the condensation efficiency and regeneration time of an adsorption cooler may both be improved.

The present systems, methods and apparatus provide a technique for improving the thermalization efficiency in the various stages of a cryogenic cycle refrigeration system. As previously discussed, a typical refrigeration system may include a plurality of "stages", where each stage roughly corresponds to a specific temperature level in the system. In conventional designs, a given stage may be enclosed within at least one closed container to provide radiation and/or magnetic shielding. In order to provide thermal isolation of the components within a shielding container, the container is typically evacuated to reduce thermal coupling between the walls of the container and the components within. However, a practical requirement of a dilution refrigerator (and/or other devices included in a refrigeration system) is to achieve base temperature from a warm start in a reasonable amount of time. Because of the large heat capacity of all of the components of the refrigerator, and also the required thermal isolation between the various stages of the refrigerator during operation (provided, at least in part, by the aforementioned shields and vacuum), cool-down may warrant special provisions in design. For example, in conventional designs portions of the refrigerator that normally operate within a specific temperature range may be enclosed inside a separate sealed vessel. In accordance with the present systems, methods and apparatus, this vessel can be permanently filled with a small quantity of exchange gas, such as helium. This may have the practical effect that all the components inside the vessel will be thermally in contact through gas conduction to each other, including a thermal link to a stage of pulse-tube cryo-cooler cold head. When the temperature becomes sufficiently low (near 10K) during a cool-down, a provision is needed to remove this gas so that thermal isolation of the components can be achieved. By attaching a small quantity of an adsorbent, such as charcoal, inside this vessel, the exchange gas may be automatically adsorbed into the charcoal when the system reaches an adsorption temperature (typically ~10K-15K). In this way, a high-vacuum condition may be achieved and the components inside the vessel may become thermally isolated from the vessel, allowing their temperature to drop below the temperature of the vessel.

Figure 17:
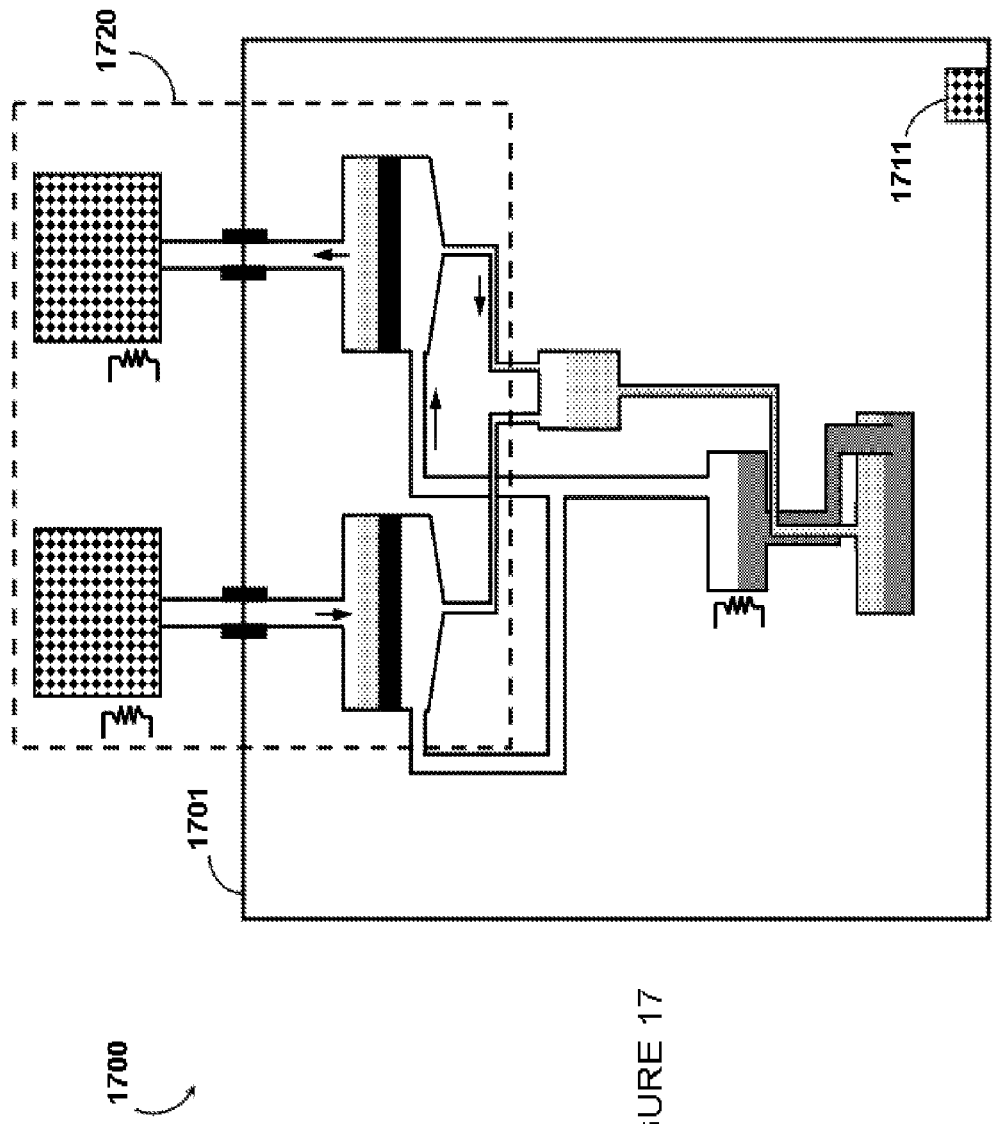
FIG. 17 is a schematic diagram of an embodiment of a cryogenic cycle refrigeration system that includes various temperature stages, where the lower temperature stages are contained within a sealed shielding vessel.

FIG. 17 is a schematic diagram of an embodiment of a cryogenic cycle refrigeration system 1700 that includes various temperature stages, where the lower temperature stages are contained within a sealed shielding vessel 1701. Shielding vessel 1701 contains a quantity of exchange gas (not shown) and an adsorbent material 1711. During cool-down of system 1700, the exchange gas provides thermal conduction to the components contained within vessel 1701, thereby reducing the cooling time of system 1700. This is because the cooling power available at the higher-temperature stage connected to vessel 1701 is much higher than the cooling power available at the lower-temperature stages inside vessel 1701. As the temperature within vessel 1701 reaches an adsorbent temperature (typically ~10K-15K), the exchange gas within vessel 1701 is adsorbed by adsorbent material 1711. At this point, vessel 1701 becomes evacuated and the lower-temperature stages increase their thermal isolation, allowing these stages to provide further cooling without loss to components outside vessel 1701. For example, vessel 1701 and its contents may readily be pre-cooled to ~10K through the thermalizing exchange gas, at which point the cryogenic cycle refrigerator 1720 may begin operating. At this temperature, adsorbent material 1711 may be activated and the exchange gas removed from vessel 1701 so that the <~10K temperature produced by cryogenic cycle refrigerator 1720 provides cooling power to the lower-temperature stages without thermal loss to vessel 1701.

A variety of substances may be used as the exchange gas within vessel 1701. In some embodiments, $^4$He may be used within vessel 1701. However, at lower temperatures $^4$He can be problematic because of its tendency to enter into a state of superfluidity, thereby forming films on various surfaces within the vessel. In some embodiments, $^3$He may be implemented instead of $^4$He. $^3$He may perform just as well as $^4$He for the purpose of gas conduction and adsorption in charcoal, but $^3$He does not form superfluid films. In some embodiments, refrigerator system 1700 itself may be enclosed inside a similar sealed vessel that is connected to the first stage of the pulse tube cryo-cooler, which may provide powerful cooling down to ~45K. In this higher-temperature vessel (not shown in FIG. 17), an alternative exchange gas, such as nitrogen, may be used. The gas in a ~45K vessel would provide thermal contact and enhanced cooling (owing to the much higher cooling power of the higher-temperature stage as compared to the lower-temperature stage) to the lower-temperature portions of the fridge within this vessel until the temperature of the vessel reached sufficiently low temperature (i.e., ~50K-60K) at which point the nitrogen would be frozen on the walls, thermally isolating the inner, ~7K vessel without the need for an adsorbent material.

Those of skill in the art will appreciate that, in some embodiments, a refrigeration system such as system 1700 may include a plurality of sealed vessels (such as vessel 1701), each containing an exchange gas and an adsorbent material. In some embodiments, at least one sealed vessel may be fully contained within another sealed vessel.

The present systems, methods and apparatus provide a thermal connection topology that may improve upon the techniques currently utilized in conventional designs. In typical refrigeration systems, a plurality of components may be thermally coupled in series to a single cold source, such as for example a cold stage of a pulse tube cold head. An example of this thermal connection scheme is illustrated in FIG. 4, where continuous cryogenic cycle refrigerator 400 includes a thermal link 401 that thermally couples both condensers 451 and 452 in series with a cold source (not shown). Such a serial coupling scheme can be disadvantageous in certain systems. For example, in a continuous cryogenic cycle refrigerator, the regenerating side is typically warmer than the pumping side. For example, in refrigerator 400, tube 413 is regenerating and tube 414 is pumping, therefore condenser 451 may be warmer than condenser 452. Because condensers 451 and 452 are thermally coupled in series, some thermal energy from condenser 451 may be undesirably coupled to condenser 452. In accordance with the present systems, methods and apparatus, such undesirable thermal coupling may be avoided by providing a "star" thermal connection topology analogous to a "star grounding" electrical topology that is often used in electrical wiring designs. In a star thermal connection topology, each component is independently thermally coupled to the cold source by a unique thermal path rather than through a shared thermal line. In some embodiments, the components may be divided into small sets, where each set corresponds to a unique thermal line and all of the components in a set are connected to the same thermal line.

Figure 18:
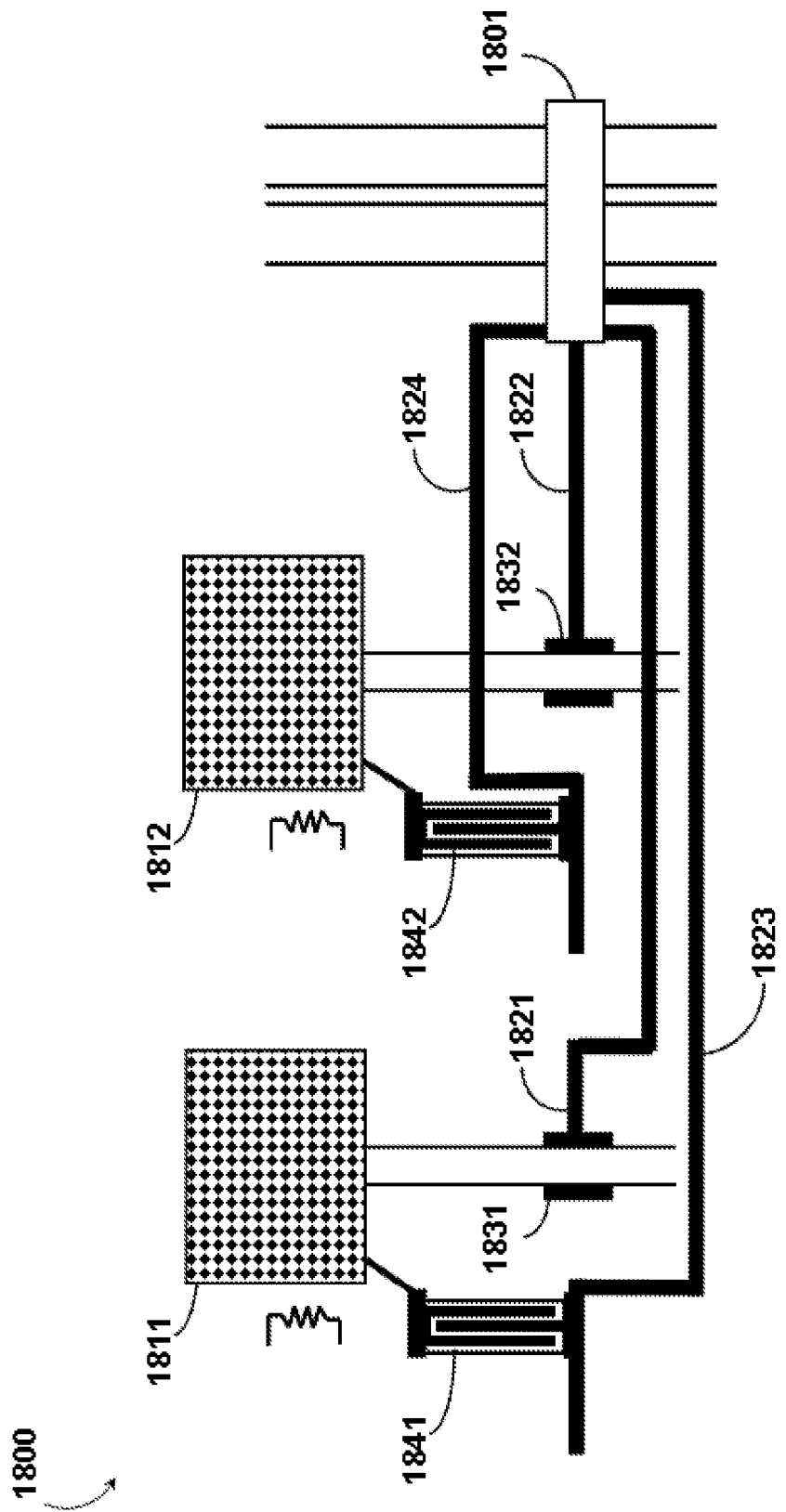
FIG. 18 is a schematic diagram of an embodiment of a refrigeration system that uses a star thermal connection topology.

FIG. 18 is a schematic diagram of an embodiment of a refrigeration system 1800 that uses a star thermal connection topology. System 1800 includes cooling stage 1801, which may, for example, be a thermal-linking point on the cold head of a pulse tube cryo-cooler (not shown). Cooling stage 1801 may provide cooling power at a specific temperature level, for example ~7K. System 1800 also includes two adsorption coolers, each with a respective adsorption pump 1811 and 1812 and a respective condenser 1831 and 1832. Adsorption pumps 1811 and 1812 are each thermally coupled to cooling stage 1801 through a respective GGHS, 1841 and 1842, respectively. In typical conventional designs, this thermal coupling would be realized through a single thermal link that connects GGHSs 1841 and 1842 in series (such as link 652 in FIG. 6A). However, in system 1800, the thermal coupling to each component is realized through a separate thermal link. Thus, pump 1811 is thermally coupled through GGHS 1841 to cooling stage 1801 by thermal link 1823; pump 1812 is thermally coupled through GGHS 1842 to cooling stage 1801 by thermal link 1824; condenser 1831 is thermally coupled to cooling stage 1801 by thermal link 1821; and condenser 1832 is thermally coupled to cooling stage 1801 by thermal link 1822. By providing a unique thermal path to each device, analogous to a star-grounding electrical topology, each component (i.e., pump 1811 through GGHS 1841, pump 1812 through GGHS 1842, condenser 1831 and condenser 1832) may be cooled with reduced parasitic heating from the other components. Those of skill in the art will appreciate that the adsorption cooler implementation of a star thermal connection topology is intended only as an illustrative embodiment. In practice, a star thermal connection topology may be applied in any refrigeration system and is not limited to application that involve adsorption coolers.

Figure 19:
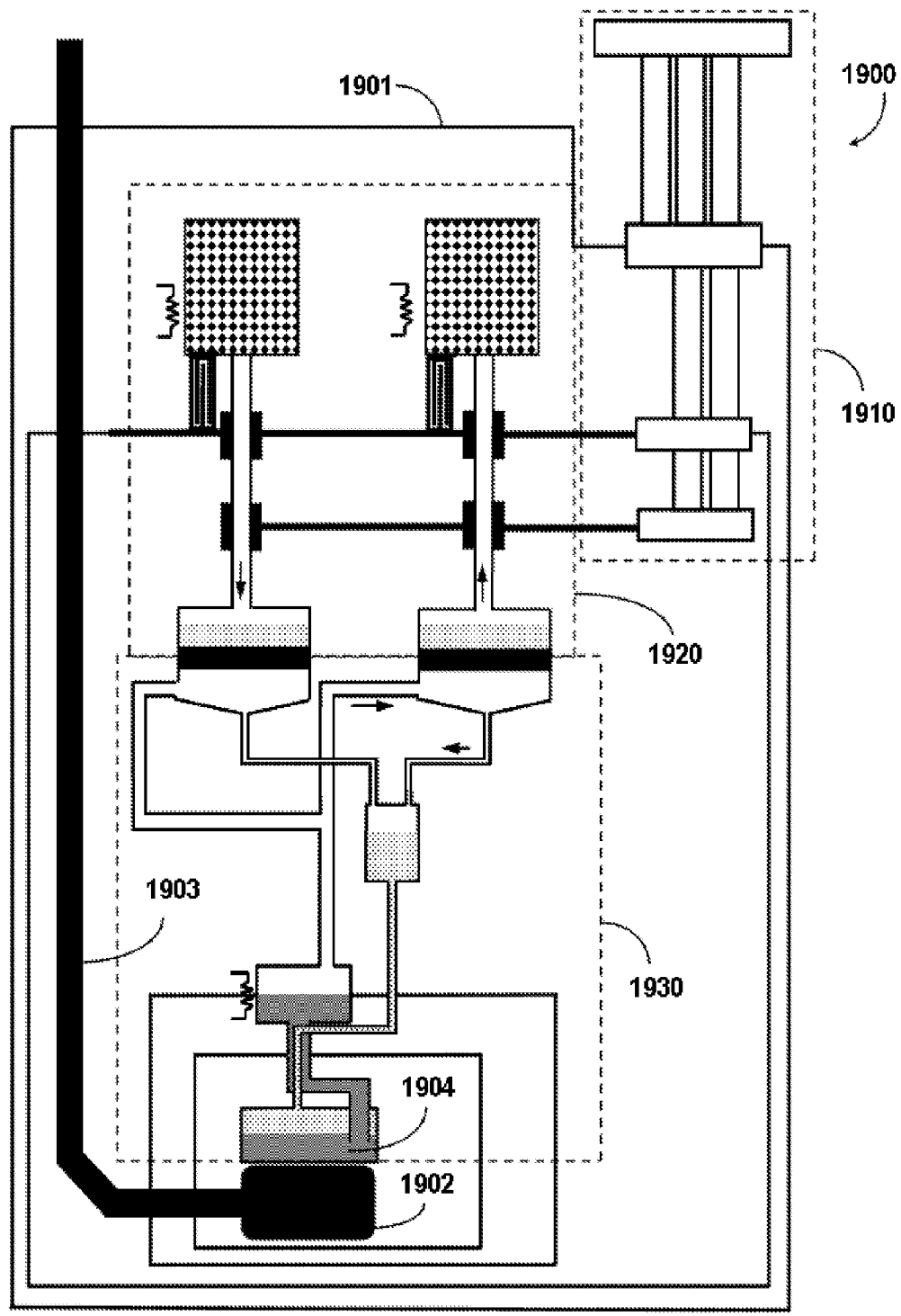
FIG. 19 is a schematic diagram of an embodiment of a superconducting computer system including a continuous cryogenic cycle pulse tube dilution refrigeration system.

As previously discussed, the various embodiments described herein may be included separately as individual improvements to existing refrigeration system designs. Alternatively, some or all of the various embodiments described herein may be combined in a single refrigeration system as part of, for example, a superconducting computer system. FIG. 19 is a schematic diagram of an embodiment of a superconducting computer system 1900 that includes a continuous cryogenic cycle pulse tube dilution refrigeration system 1901 incorporating an exemplary combination of the improvements described herein. System 1900 may be advantageous in many applications because it is capable of providing very low temperatures (in the milliKelvin temperature range) without requiring the external gas handling system typically found in CDRs. System 1900 is compact and has excellent long-term reliability. As previously described, a superconducting processor, such as a superconducting quantum processor, must be operated at cryogenic temperature. Furthermore, a superconducting quantum processor may be particularly sensitive to magnetic fields. A CCCPTDR, such as system 1901, is particularly well-suited for providing an operating environment for a superconducting quantum processor. The processor device (represented by device 1902 in FIG. 19) may be thermally coupled to the mixing chamber 1904 of system 1901. Thus, the processor device 1902 may be cooled to a temperature of <100-mK while being contained within a plurality of nested shields. These shields may assist in providing a thermally, magnetically, and electrically "quiet" environment in which the superconducting processor may operate.

System 1900 includes wiring system 1903. In some embodiments, wiring system 1903 may include an input/output system for communicating between device 1902 and some external (i.e., room temperature) device(s) (not shown). Examples of such input/output systems are fully described in U.S. patent application Ser. No. 12/016,801, U.S. patent application Ser. No. 12/256,332, and U.S. Provisional Patent Application Ser. No. 61/080,996 filed Jul. 15, 2008 and entitled "Input/Output System and Devices for Use with Superconducting Devices."

In known conventional designs, superconducting processors and superconducting quantum devices are typically cooled using elaborate cryogenic dilution refrigerators that require complicated external gas handling systems. In accordance with the present systems, methods and apparatus, a superconducting processor, such as a superconducting quantum processor, may be cooled by a compact and reliable CCCPTDR. In addition to the advantages already described, a CCCPTDR provides improved packaging for the commercialization of superconducting processor systems.

Those of skill in the art will appreciate that while a superconducting processor device 1902 is illustrated in combination with a complete CCCPTDR system, the operation of a superconducting processor may be improved by implementing any or all of the various embodiments described herein. For example, the operation of a superconducting processor, such as a superconducting quantum processor, may also be improved by implementing any of the various embodiments described herein in conjunction with a pulse tube dilution refrigerator (PTDR) that does include an external gas handling system.

Many of the various embodiments described herein implement at least one "thermal link" such as, for example, thermal links 401, 531, 532, 1005, 1104, 1105, 1204, 1205, 1211, and 1821-1824. A thermal link is generally implemented in order to provide thermal coupling to and/or from a source of cooling power in the refrigeration system. By thermally linking a device or component to a source of cooling power in the refrigeration system, the device or component may be "thermalized" such that its temperature is substantially similar to that of the source of cooling power to which it is thermally linked. For example, in FIG. 19 the superconducting processor device 1902 is thermally coupled to, and therefore thermalized by, the mixing chamber 1904. A further aspect of the present systems, methods and apparatus provides for the thermalization of electrical wires, such as wiring system 1903, within a refrigeration system.

Electrical wires (e.g., wiring system 1903 for providing input/output control of superconducting processor device 1902) are sources of heat within a refrigeration system. Current flowing through the wires when the wires are not superconducting may produce heat through Joule heating, and the wires may also conduct heat into the system if they extend beyond the refrigerated environment to communicate with, for example, room temperature electronics. If left unchecked, the heat propagated along electrical wires 1903 that communicate with a superconducting processor device 1902 can adversely affect the performance of the superconducting processor device 1902 by, for example, increasing the thermal noise seen by the components of the processor device. For this reason, it is generally desirable to thermalize the electrical wires 1903 to a temperature that is substantially similar to the operation temperature of the superconducting processor device 1902. In some embodiments, superconducting processor 1902 may be operated at the base temperature of refrigeration system 1901, therefore electrical wires 1903 may need to be thermalized to approximately the same temperature As previously described, thermalization to an approximate temperature may be achieved by thermal coupling to a source of cooling power at that temperature. However, heat energy is generally more difficult to thermalize at lower temperatures. As temperature decreases, a given amount of heat is more difficult to remove from a system at least partially because refrigeration systems tend to become increasingly inefficient at lower temperatures. A typical refrigeration system may be capable of providing cooling power in the range of Watts at temperatures around 50K, but the cooling power drops to the range of milliWatts at temperatures around 4K. For components that need to be thermalized to the base temperature of the refrigeration system (which may, for example, be in the range of milliKelvin), it is therefore desirable to thermalize in stages (e.g., at successively decreasing temperatures) so that only a portion of the heat energy is thermalized at any given stage. That is, electrical wires 1903 may be thermalized at several points throughout refrigeration system 1901 such that the cooling power available at the operation temperature of superconducting processor device 1902 is sufficient to thermalize electrical wires 1903 to approximately that temperature.

The present systems, methods and apparatus describe a thermal linking system that takes advantage of the relative cooling powers available over a temperature gradient within a cryogenic refrigeration system in order to provide improved thermalization of electrical wires. Any component within a refrigeration system that connects between components of two different temperatures, one warmer and one colder, may embody a temperature gradient over the portion of its length that is in between the warmer temperature and the colder temperature. Such a temperature gradient may be linear, substantially linear, or substantially non-linear, or it may exhibit at least one substantially linear and/or at least one substantially non-linear portion. An example of a component embodying a temperature gradient is the regenerator in a pulse tube cryo-cooler.

In some embodiments, a length of electrical wires 1903 within a refrigeration system may be substantially continuously thermally coupled to a length that embodies a temperature gradient. For example, a portion of the length of electrical wires 1903 may be substantially continuously thermally coupled to the regenerator in a pulse tube cryo-cooler by physically coupling a length of electrical wires 1903 over at least a portion of the length of the regenerator. However, in some applications it may not be practical to establish direct thermal coupling between electrical wires 1903 and a component of the refrigeration system embodying a temperature gradient. The present systems, methods and apparatus describe the implementation of flexible printed circuit boards as thermal links for providing thermal coupling over a temperature gradient.

Figure 20:
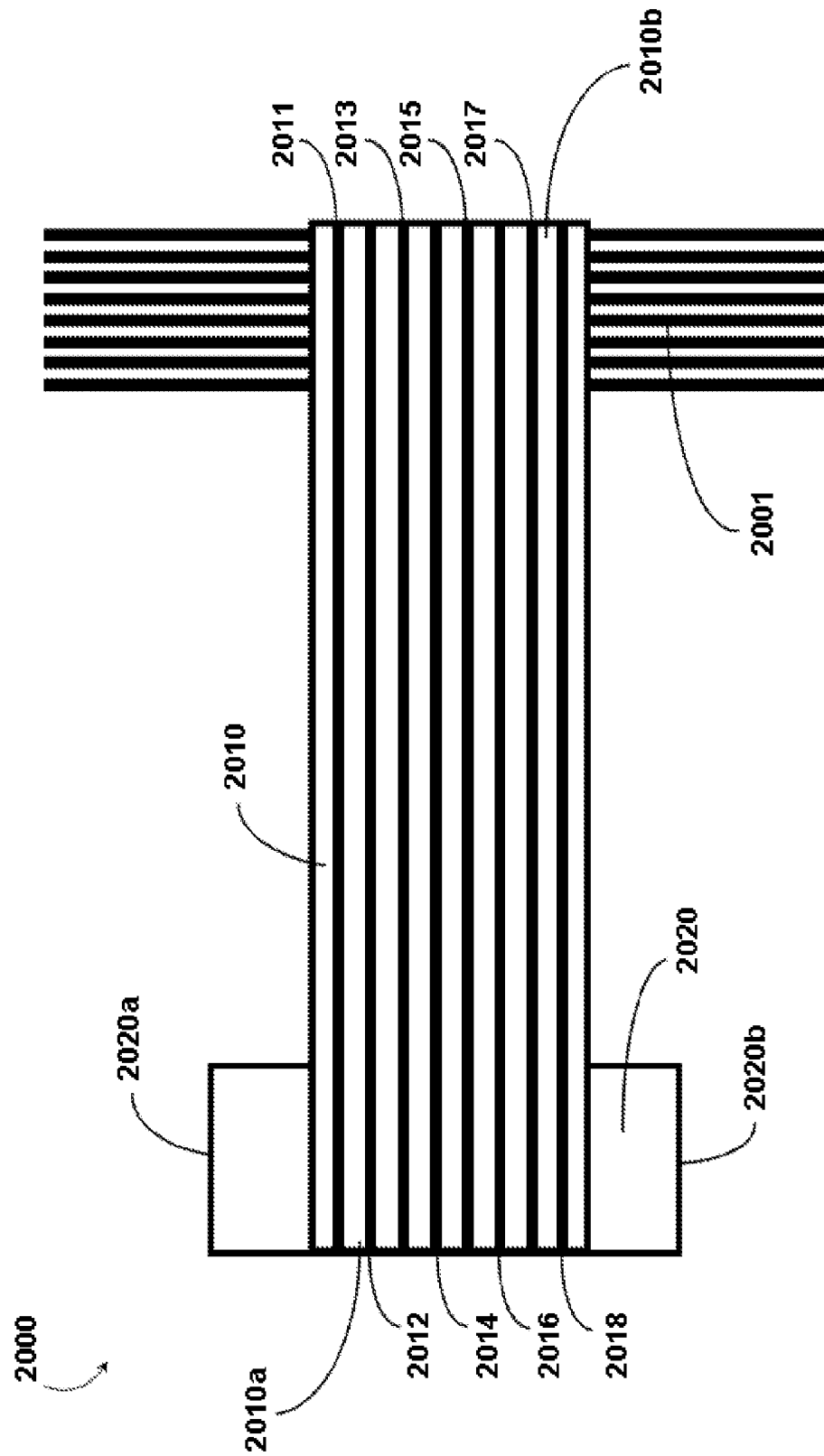
FIG. 20 is a schematic diagram of an embodiment of a thermal linking system for providing thermal coupling over a temperature gradient.

FIG. 20 is a schematic diagram of an embodiment of a thermal linking system 2000 for providing thermal coupling over a temperature gradient. Thermal linking system 2000 includes a set of electrical wires 2001, a flexible printed circuit board 2010 that has a first end 2010*a*, a second end 2010*b* and carries a plurality of thermally conductive traces 2011-2018, and a component 2020 of a refrigeration system that embodies a temperature gradient. Component 2020 has a first end 2020*a* at a first temperature and a second end 2020*b* at a second temperature, where the second temperature is colder than the first temperature such that a temperature gradient exists between the first end 2020*a* and the second end 2020*b*. The first end 2010*a* of flexible printed circuit board 2010 is thermally coupled to component 2020 such that each of thermally conductive traces 2011-2018 is thermally linked to component 2020 at a different point along the temperature gradient. For example, trace 2011 is thermally linked to a first point on component 2020 and trace 2012 is thermally linked to a second point on component 2020. Because component 2020 embodies a temperature gradient, the temperature of the second point on component 2020 is colder than the temperature of the first point on component 2020. Thus, trace 2015 is thermalized to a comparatively colder temperature than trace 2011. As previously described, more cooling power is typically available at warmer temperatures, thus trace 2011 may convey more cooling power than trace 2015.

The second end 2010*b* of flexible printed circuit board 2010 is thermally coupled to the set of electrical wires 2001 such that each of thermally conductive traces 2011-2018 is thermally linked to wires 2001. Thus, thermal linking system 2000 effectively uses a single flexible printed circuit board 2010 to establish a plurality of thermal links (one through each of traces 2011-2018) in between component 2020 and electrical wires 2001, where the thermal links are realized at successively colder temperatures due to the temperature gradient in component 2020. By thermally linking to successively colder temperatures, thermal linking system 2000 may improve the efficiency of the thermalization of electrical wires 2001.

In some embodiments, component 2020 may include a regenerator in a pulse tube cryo-cooler. In typical single-stage pulse tube cryo-coolers, the regenerator embodies a temperature gradient from room temperature right down to the base temperature of the cryo-cooler. In typical multi-stage pulse tube cryo-coolers, multiple regenerators may be implemented where each regenerator embodies a temperature gradient from room temperature down to the base temperature of the stage to which the regenerator corresponds. Pulse tube regenerators are a source of cooling power(s) that are generally not taken advantage of in refrigeration systems.

In the illustrated embodiment of FIG. 20, thermal linking system 2000 implements a flexible printed circuit board to establish thermal links between component 2020 and wires 2001. Flexible printed circuit boards are known in the art. An example of a flexible printed circuit board may comprise a dielectric substrate, for example a dielectric laminate (e.g., a polyimide such as Kapton®) or other material (e.g., non-laminate substrate), that carries at least two conductive traces. In the present systems, methods and apparatus, a flexible printed circuit board (2010) is used to conduct heat as opposed to electricity; thus, it may be desirable for the conductive traces to be formed of a material of high thermal conductivity at cryogenic temperatures (e.g., a non-superconducting metal such as copper) and for the dielectric substrate to provide substantial thermal isolation in between traces. Use of a laminate may advantageously enhance the ability to prevent conduction of heat between adjacent ones of the thermally conductive traces over non-laminate structures. In some embodiments, the thermally conductive traces 2011-2018 may be electrically isolated from the electrical wires 2001. In some embodiments, thermally conductive traces 2011-2018 may be sandwiched between at least two layers of dielectric substrate.

In some embodiments, thermal linking system 2000 may implement a rigid printed circuit board as opposed to a flexible printed circuit board 2010; however, a flexible printed circuit board may generally be preferred as it may more readily accommodate various spatial arrangements within the refrigerated environment. Furthermore, those of skill in the art will appreciate that flexible printed circuit board 2001 may include any number of thermally conductive traces 2011-2018.

In accordance with present systems, methods and apparatus, any of the thermal links implemented herein (e.g., thermal links 401, 531, 532, 1005, 1104, 1105, 1204, 1205, 1211, and 1821-1824) may, in some embodiments, be realized by a flexible printed circuit board that carries at least one thermally conductive trace.

Refrigeration system 1901 from FIG. 19 includes three cooling stages: pulse tube cryo-cooler 1910, adsorption cooler system 1920, and dilution refrigerator 1930. In this example, pulse tube cryo-cooler 1910 is used to cool system 1901 down from room temperature to a first temperature range (e.g., ~3K) at which adsorption cooler system 1920 is activated. Once activated, adsorption cooler system 1920 is used to cool dilution refrigerator 1930 down to a second temperature range (e.g., ~0.5K) at which dilution refrigerator 1930 may be activated. Dilution refrigerator 1930 is then used to provide the base (e.g., ~0.01K) temperature in refrigeration system 1901. As previously described, the available cooling power typically decreases at successively colder temperature stages. For this reason, at least some of the cooling power provided by pulse tube cryo-cooler 1910 may be used to "pre-cool" all of the components of dilution refrigerator 1930 down to the first temperature range (e.g., ~3K) so that adsorption cooler system 1920 is only required to cool dilution refrigerator 1930 down from the first temperature range (e.g., ~3K) to the second temperature range (e.g., ~0.5K) as opposed to cooling it all the way down from room temperature. Once dilution refrigerator 1930 has been activated, however, thermal coupling between pulse tube cryo-cooler 1910 and all of the components of dilution refrigerator 1930 may longer be desired. This is because the dilution process cools at least some of the components of dilution refrigerator 1930 (e.g., the mixing chamber 1904) down to a temperature range that is far below that of pulse tube cryo-cooler 1910, so that pulse tube cryo-cooler 1910 actually becomes a relative source of undesirable heat. Indeed, in any refrigeration system that implements a dilution refrigerator, it is typically desirable to pre-cool the dilution refrigerator using an initial source of cooling power (e.g., a pulse tube cryo-cooler or a bath of $^3$He or $^4$He) but then, once this pre-cooling has been achieved and the dilution refrigerator is activated, to substantially thermally isolate at least the mixing chamber of the dilution refrigerator from the initial source of cooling power. To this end, a switchable thermalization system may be implemented. Such a switchable thermalization system is typically realized by including an exchange gas (e.g., $^3$He or $^4$He) in the vacuum space that contains the dilution refrigerator and pumping this exchange gas out of the vacuum space once the pre-cooling is complete.

In general, it is advantageous to implement a switchable thermalization system in between cooling stages that are at different temperatures within a refrigeration system. This is because cooling power at a first temperature that is initially used to pre-cool a component of the system may later become a relative source of heat when the pre-cooled components of the system continue to cool below the first temperature. Furthermore, the pre-cooling system may unnecessarily continue to draw cooling power from the initial source of cooling power. In the previous example, a switchable thermalization system is desired to couple between an initial source of cooling power (e.g., a pulse tube cryo-cooler or a bath of $^3$He or $^4$He) and a dilution refrigerator, but a switchable thermalization system may similarly be desired to couple between any two cooling stages that provide cooling power at different temperatures. For example, a single pulse tube cryo-cooler may provide cooling power at multiple stages with each stage corresponding to a different temperature. In such a case, it may be advantageous to include a switchable thermalization system in between the multiple stages of the pulse tube cryo-cooler.

The present systems, methods and apparatus describe improved switchable thermalization systems for use in pre-cooling at least some of the components of a refrigeration system. In some embodiments, an improved switchable thermalization system implements passive thermal switches realized by thermal links formed of superconducting material. In some embodiments, an improved switchable thermalization system implements active thermal switches realized by GGHSs or other forms of controllable heat switches.

Figure 21:
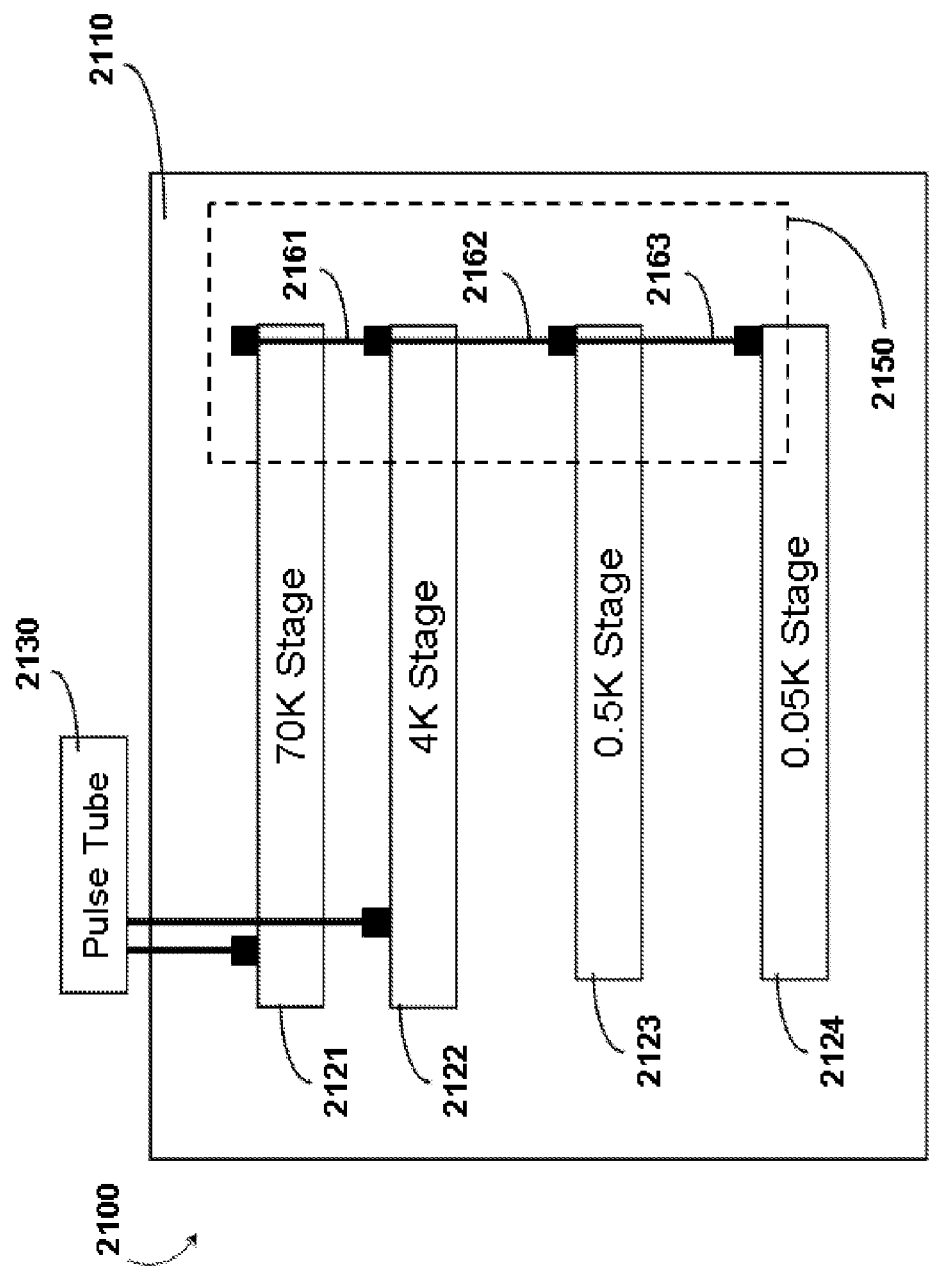
FIG. 21 is a schematic diagram of an embodiment of a refrigeration system that includes an improved switchable thermalization system for use in pre-cooling at least some of the components of the refrigeration system.

FIG. 21 is a schematic diagram of an embodiment of a refrigeration system 2100 that includes an improved switchable thermalization system 2150 for use in pre-cooling at least some of the components of the refrigeration system 2100. Refrigeration system 2100 includes a vacuum space 2110 that contains multiple stages 2121-2124 which successively provide cooling power at progressively colder temperatures. For example, stage 2121 may be thermally coupled to a first stage of a pulse tube cryo-cooler 2130 and provide cooling power at a first temperature (e.g., ~70K); stage 2122 may be thermally coupled to a second stage of a pulse tube cryo-cooler 2130 and provide cooling power at a second temperature (e.g., ~4K); stage 2123 may be thermally coupled to an evaporation pot in an adsorption cooler system and provide cooling power at a third temperature (e.g., ~0.5K); and stage 2124 may be thermally coupled to a mixing chamber in a dilution refrigerator and provide cooling power at a fourth temperature (e.g., ~0.05K). Those of skill in the art will appreciate that a refrigeration system may include any number of stages each providing cooling power at any cryogenic temperature. The number of stages and their respective temperatures in refrigeration system 2100 are intended only to provide an illustrative example of multi-stage cooling.

Refrigeration system 2100 includes improved switchable thermalization system 2150 for use in pre-cooling at least some of the components of the refrigeration system 2100. The cooling power available at any particular stage typically depends on the temperature of that stage such that more cooling power is generally available at higher temperatures than at lower temperatures. For this reason, it is generally advantageous to thermally couple each successive stage to the previous stages. Improved switchable thermalization system 2150 includes a plurality of switchable thermal links 2161-2163 that provide thermal coupling in between successive stages in refrigeration system 2100. Stage 2122 may be thermally coupled to stage 2121 through switchable thermal link 2161, stage 2123 may be thermally coupled to stage 2122 through switchable thermal link 2162, and stage 2124 may be thermally coupled to stage 2123 through switchable thermal link 2163. Therefore, with stage 2121 cooled to 70K, cooling stage 2122 to ~4K only involves cooling stage 2122 from ~70K to ~4K, cooling stage 2123 to ~0.5K only involves cooling stage 2123 from ~4K to ~0.5K, and cooling stage 2124 to ~0.05K only involves cooling stage 2124 from ~0.5K to ~0.05K.

Many multi-stage refrigeration systems include multiple sources of cooling power. For example, refrigeration system 1901 from FIG. 19 includes three sources of cooling power: pulse tube cryo-cooler 1910, adsorption cooler system 1920, and dilution refrigerator 1930. In such systems, a first source of cooling power (e.g., pulse tube cryo-cooler 1910) may be used to provide a temperature that is necessary in order for a second source of cooling power (e.g., adsorption cooler system 1920) to function. Similarly, the second source of cooling power (e.g., adsorption cooler system 1920) may be used to provide a temperature that is necessary for a third source of cooling power (e.g., dilution refrigerator 1930) to function. In this example, the first source of cooling power (e.g., the pulse tube cryo-cooler 1910) may be used to pre-cool the components of the refrigeration system to a first temperature. The pre-cooling may be established by thermalizing the components of the refrigeration system to the first temperature through thermal links providing thermal coupling. However, after the pre-cooling is complete and a second source of cooling power (e.g., adsorption cooler system 1920 or dilution refrigerator 1930) begins to function, it may be desirable to cease the thermal coupling between the first source of cooling power and at least some of the other components of the refrigeration system.

Improved switchable thermalization system 2150 in refrigeration system 2100 implements switchable thermal links 2161-2163 that may be used to establish thermal coupling between specific components during, for example, pre-cooling of the system. Switchable thermal links 2161-2163 may then be "switched" to provide substantial thermal isolation between the same components after pre-cooling is complete. In some embodiments, this thermal "switching" may be achieved passively by implementing switchable thermal links 2161-2163 that naturally transition from providing good thermal coupling (i.e., links with high thermal conductivity) to providing substantial thermal isolation (i.e., links with low thermal conductivity) at a desired point in the operation of refrigeration system 2100. For example, in some embodiments each of switchable thermal links 2161-2163 may be formed of a material that is superconducting below a critical temperature. Many superconducting materials (e.g., aluminum, tin, lead, etc.) are metals that generally exhibit high thermal conductivity until they are cooled below their critical temperature. When cooled below their critical temperature, these metals transition into the superconducting regime where their thermal conductivity quickly drops to a very low level. Thus, each of switchable thermal links 2161-2163 may be formed of a metal that is superconducting below a critical temperature, such that each of switchable thermal inks 2161-2163 provides thermal coupling between specific components while refrigeration system 2100 is pre-cooling and, once refrigeration system 2100 cools below the critical temperature(s) of switchable thermal links 2161-2163, each of switchable thermal links 2161-2163 becomes superconducting and provides substantial thermal isolation between the same components in refrigeration system 2100. A further advantage of implementing superconducting metals as switchable thermal links 2161-2163 is that, in such embodiments, the switchable thermal links 2161-2163 may simultaneously provide electrical grounding between the respective components (e.g., stages) between which they couple.

In alternative embodiments, at least one of switchable thermal inks 2161-2163 may be established through a GGHS, such as GGHS 700 from FIG. 7.

In some embodiments, thermal switching in switchable thermal links 2161-2163 may be achieved actively by using controllable thermal switches. An example of an appropriate controllable thermal switch is one that enables controllable thermal contact between two thermal terminals. In some embodiments, a controllable thermal switch may use magnetic attractive or repulsive forces to enable controllable thermal contact between two thermal terminals. For example, a controllable thermal switch may include two anti-parallel solenoids each formed by a respective superconducting non-dissipative coil. In some embodiments, at least one solenoid may comprise a pancake coil carried on a flexible printed circuit board. By passing electrical current through the two solenoids, a mutual attraction may be induced that causes the flexible printed circuit board to move towards and establish thermal contact between two thermal terminals. Similarly, a different configuration of electrical currents may be used to induce a mutual repulsion that causes the two thermal terminals to move apart.

Those of skill I the art will appreciate that a refrigeration system, such as refrigeration system 2100, may include any number of stages (e.g., stages 2121-2124) each operated at any cryogenic temperature (i.e., the temperatures illustrated in FIG. 21 are used for exemplary purposes only). Similarly, a switchable thermalization system, such as switchable thermalization system 2150, may include any number of switchable thermal links (e.g., switchable thermal links 2161-2163) arranged to thermally couple between any components and/or stages in the refrigeration system. For example, switchable thermalization system 2150 may include any number of additional switchable thermal links two provide direct thermal coupling between any pair of stages 2121-2124. That is, switchable thermalization system 2150 may include a switchable thermal link (not shown) that is configured to provide direct thermal coupling between two stages (e.g., stages 2122 and 2124) that are separated by at least one intermediate stage (e.g., stage 2123).

Those of skill in the art will appreciate that the embodiments illustrated in the present systems, methods and apparatus are generally simplifications intended to highlight specific characteristics and/or components. In some instances, additional characteristics and/or components that are not illustrated in the various embodiments described herein may be implemented in a real physical system. For example, in some embodiments a dilution refrigerator may include a means for evacuating gaseous coolant when the system is heated in order to relieve pressure.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus of quantum computation, not necessarily the exemplary systems, methods and apparatus for quantum computation generally described above.

The various embodiments described above can be combined to provide further embodiments. All of the US patents, US patent application publications, US patent applications, foreign patents, foreign patent applications and non-patent publications referred to in this specification and/or listed in the Application Data Sheet, including but not limited to U.S. patent application Ser. No. 12/811,067, filed Jun. 28, 2010 and entitled "Systems, Methods and Apparatus for Cryogenic Refrigeration", US Provisional Patent Application Ser. No. 61/017,460, filed Dec. 28, 2007 and entitled "Systems, Methods, and Apparatus for Cryogenic Cycle Refrigeration", U.S. Provisional Patent Application Ser. No. 61/083,439, filed Jul. 24, 2008 and entitled "Systems, Methods and Apparatus for Cryogenic Refrigeration", U.S. Provisional Patent Application Ser. No. 61/086,432, filed Aug. 5, 2008 and entitled "Systems, Methods and Apparatus for Cryogenic Refrigeration", US Patent Publication No. 2006-0225165, US Patent Publication No. 2008-0176750, U.S. patent application Ser. No. 12/266,378, U.S. Provisional Patent Application Ser. No. 61/039,710, filed Mar. 26, 2008 and entitled "Systems, Devices, And Methods For Analog Processing", US Patent Publication No. 2006-0147154, U.S. patent application Ser. No. 12/017,995, U.S. patent application Ser. No. 12/016,801, U.S. patent application Ser. No. 12/256,332, and U.S. Provisional Patent Application Ser. No. 61/080,996 filed Jul. 15, 2008 and entitled "Input/Output System and Devices for Use with Superconducting Devices" are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A cryogenic cycle refrigeration system comprising:
a first adsorption pump and a second adsorption pump, both the first and the second adsorption pumps including a respective quantity of adsorbent material;
a plurality of tubular channels each capable of providing fluid passage therethrough, wherein a first one and a second one of the tubular channels both include a respective condensation region, the respective condensation regions each thermally coupled to at least one cold source within the refrigeration system;
a first evaporation pot and a second evaporation pot, each of the first and the second evaporation pots coupled to a respective one of the first and the second adsorption pumps by a respective one of the first and the second tubular channels;
a heat exchanger that provides thermal coupling between at least two of the tubular channels; and
a third tubular channel and a fourth tubular channel, the third tubular channel coupled in parallel with the first tubular channel to provide fluid communication between the first adsorption pump and the first evaporation pot, and the fourth tubular channel coupled in parallel with the second tubular channel to provide fluid communication between the second adsorption pump and the second evaporation pot, and wherein the heat exchanger includes a first thermal link coupled between the first and the fourth tubular channels and a second thermal link coupled between the second and the third tubular channels.

2. The refrigeration system of claim 1, further comprising:
a first and a second quantity of coolant substance, each of the first and the second quantities of coolant substance contained within a respective one of the first and the second evaporation pots.

3. The refrigeration system of claim 2 wherein each of the first and the second quantities of coolant substance is selected from a group consisting of helium-3 and helium-4.

4. The refrigeration system of claim 1, further comprising a pulse tube cryo-cooler, wherein the respective condensation regions are each thermally coupled to the pulse tube cryo-cooler and wherein the heat exchanger is thermally coupled to the first one of the tubular channels at a point that is positioned in between the condensation region of the first one of the tubular channels and the first evaporation pot and the heat exchanger is thermally coupled to the second one of the tubular channels at a point that is positioned in between the condensation region of the second one of the tubular channels and the second evaporation pot.

5. The refrigeration system of claim 1, further comprising a dilution refrigerator that is thermally coupled to the first and the second evaporation pots.

6. The refrigeration system of claim 5, further comprising a superconducting processor that is thermally coupled to the dilution refrigerator.

7. The refrigeration system of claim 6 wherein the superconducting processor includes a superconducting quantum processor.

* * * * *